US012593479B2

(12) United States Patent
Yoshida et al.

(10) Patent No.: US 12,593,479 B2
(45) Date of Patent: Mar. 31, 2026

(54) SEMICONDUCTOR DEVICE HAVING AN EDGE TERMINATION STRUCTURE AND MANUFACTURING METHOD THEREOF

(71) Applicant: FUJI ELECTRIC CO., LTD.,
Kanagawa (JP)

(72) Inventors: Kosuke Yoshida, Matsumoto-city (JP);
Koh Yoshikawa, Matsumoto-city (JP);
Nao Suganuma, Matsumoto-city (JP)

(73) Assignee: FUJI ELECTRIC CO., LTD.,
Kanagawa (JP)

( * ) Notice: Subject to any disclaimer, the term of this
patent is extended or adjusted under 35
U.S.C. 154(b) by 706 days.

(21) Appl. No.: 17/892,177

(22) Filed: Aug. 22, 2022

(65) Prior Publication Data

US 2023/0085529 A1     Mar. 16, 2023

(30) Foreign Application Priority Data

Sep. 15, 2021     (JP) ................................. 2021-150108

(51) Int. Cl.
H10D 62/10          (2025.01)
H10D 12/00          (2025.01)
H10D 64/00          (2025.01)
(52) U.S. Cl.
CPC ......... H10D 62/106 (2025.01); H10D 12/481
(2025.01); H10D 62/127 (2025.01); **H10D
64/112** (2025.01)
(58) Field of Classification Search
CPC .. H10D 62/106; H10D 12/481; H10D 62/127;
H10D 64/112; H10D 62/129;

(Continued)

(56) References Cited

U.S. PATENT DOCUMENTS 5,747,851 A     5/1998  Tomatsu
9,570,541 B2 *  2/2017  Mizushima ............ H10D 8/043
(Continued)

FOREIGN PATENT DOCUMENTS

JP          H08167715 A  *  6/1996
JP          H09153613 A     6/1997
(Continued)

OTHER PUBLICATIONS

Office Action issued for counterpart Japanese Application No.
2021-150108, transmitted from the Japanese Patent Office on May
27, 2025 (drafted on May 20, 2025).
(Continued)

*Primary Examiner* — Mohammad M Hoque

(57)          ABSTRACT

Provided is a semiconductor device including: a semiconductor substrate having a drift region of a first conductivity type; an active portion, in which at least one of a transistor portion and a diode portion is provided, in the semiconductor substrate; and an edge termination structure portion provided farther outward than the active portion in the semiconductor substrate, wherein the edge termination structure portion has a plurality of guard rings of a second conductivity type provided in contact with an upper surface of the semiconductor substrate, and an embedded dielectric film arranged between two guard rings and at least partially embedded in the semiconductor substrate, and the guard rings are provided up to a position below the embedded dielectric film.

14 Claims, 20 Drawing Sheets

(58) Field of Classification Search
CPC .... H10D 8/422; H10D 64/117; H10D 62/112; H10D 62/142; H10D 62/115
USPC ......................................................... 257/330
See application file for complete search history.

(56) References Cited

U.S. PATENT DOCUMENTS

| | | | |
|---|---|---|---|
| 2003/0218220 A1 | 11/2003 | Takahashi | |
| 2011/0291241 A1 | 12/2011 | Yoshikawa | |
| 2013/0214394 A1 | 8/2013 | Senoo | |
| 2015/0249149 A1 | 9/2015 | Lu | |
| 2015/0349066 A1 | 12/2015 | Caspary | |
| 2016/0197171 A1 | 7/2016 | Onozawa | |
| 2017/0062568 A1 | 3/2017 | Caspary | |
| 2017/0229448 A1 | 8/2017 | Tanaka | |
| 2018/0151366 A1* | 5/2018 | Endo ...................... | H10D 30/60 |
| 2019/0019885 A1* | 1/2019 | Naito ................... | H10D 62/393 |
| 2019/0035884 A1 | 1/2019 | Bauer | |
| 2019/0326432 A1* | 10/2019 | Nakazawa ............. | H10D 8/411 |
| 2020/0395215 A1 | 12/2020 | Kubouchi | |
| 2021/0265492 A1 | 8/2021 | Takishita | |

FOREIGN PATENT DOCUMENTS

| JP | H10270370 A | * | 10/1998 |
|---|---|---|---|
| JP | H1167753 A | | 3/1999 |
| JP | H11297688 A | | 10/1999 |
| JP | 2003347547 A | | 12/2003 |
| JP | 2007042826 A | * | 2/2007 |
| JP | 2007266520 A | | 10/2007 |
| JP | 2008193043 A | | 8/2008 |
| JP | 2009099863 A | | 5/2009 |
| JP | 2010118440 A | * | 5/2010 |
| JP | 2011249580 A | | 12/2011 |
| JP | 2013172087 A | | 9/2013 |
| JP | 2013172088 A | | 9/2013 |
| JP | 2015226066 A | | 12/2015 |
| JP | 2017143136 A | | 8/2017 |
| JP | 2019500746 A | | 1/2019 |
| JP | 2019106554 A | | 6/2019 |
| JP | 2019192678 A | | 10/2019 |
| JP | 2020205408 A | | 12/2020 |
| WO | 9629744 A1 | | 9/1996 |
| WO | 2014112057 A1 | | 7/2014 |
| WO | 2015141327 A1 | | 9/2015 |
| WO | 2020230900 A1 | | 11/2020 |

OTHER PUBLICATIONS

Office Action issued for counterpart Japanese Application No. 2021-150108, transmitted from the Japanese Patent Office on Oct. 7, 2025 (drafted on Sep. 29, 2025).

* cited by examiner

SEMICONDUCTOR DEVICE HAVING AN EDGE TERMINATION STRUCTURE AND MANUFACTURING METHOD THEREOF

The contents of the following Japanese patent application(s) are incorporated herein by reference:

No. 2021-150108 filed in JP on Sep. 15, 2021.

BACKGROUND

1. Technical Field

The present invention relates to a semiconductor device and a manufacturing method.

2. Related Art

Conventionally, known is a semiconductor device having an edge termination structure portion including a guard ring (for example, refer to Patent Document 1). Patent Document 1: Japanese Patent Application Publication No. 2017-143136

The summary clause does not necessarily describe all necessary features of the embodiments of the present invention. The present invention may also be a sub-addition of the features described above.

DESCRIPTION OF EXEMPLARY EMBODIMENTS

Figure 1:
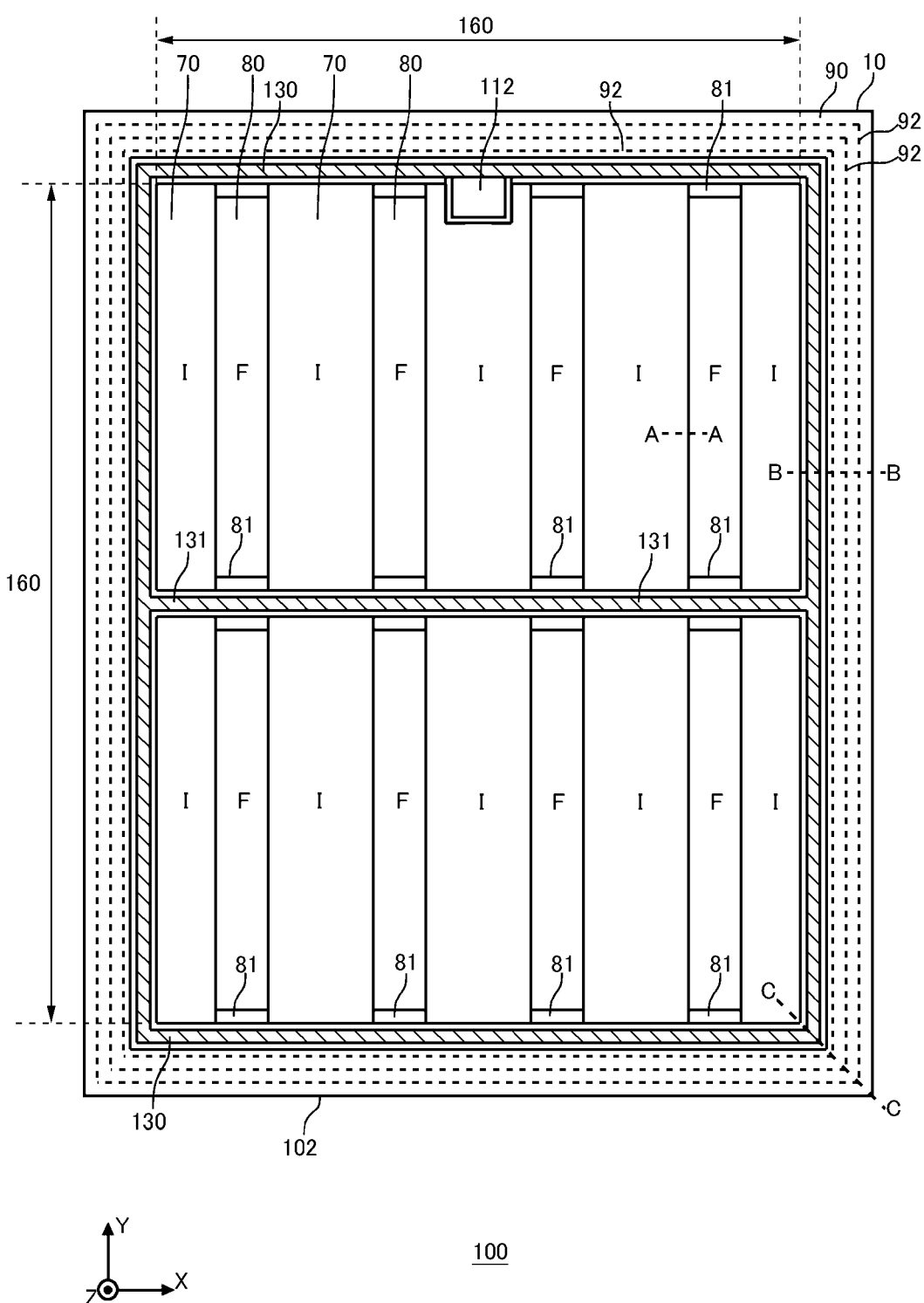
FIG. 1 is an example of a top view of a semiconductor device 100.

Hereinafter, the invention will be described through embodiments of the invention, but the following embodiments do not limit the invention according to claims. In addition, not all of the combinations of features described in the embodiments are essential to the solving means of the invention.

As used herein, one side in a direction parallel to a depth direction of a semiconductor substrate is referred to as "upper" and the other side is referred to as "lower". One surface of two principal surfaces of a substrate, a layer or other member is referred to as an upper surface, and the other surface is referred to as a lower surface. "Upper" and "lower" directions are not limited to a direction of gravity, or a direction in which a semiconductor device is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. Note that, a +Z axis direction and a −Z axis direction are directions opposite to each other. When the Z axis direction is described without describing the signs, it means that the direction is parallel to the +Z axis and the −Z axis.

In the present specification, orthogonal axes parallel to the upper surface and the lower surface of the semiconductor substrate are referred to as the X axis and the Y axis. Further, an axis perpendicular to the upper surface and the lower surface of the semiconductor substrate is referred to as the Z axis. In the present specification, the direction of the Z axis may be referred to as the depth direction. Further, in the present specification, a direction parallel to the upper surface and the lower surface of the semiconductor substrate may be referred to as a horizontal direction, including an X axis direction and a Y axis direction. As used herein, when referring to the upper surface side of the semiconductor substrate, it refers to a region ranging from the center to the upper surface in the depth direction of the semiconductor substrate. When referring to the lower surface side of the semiconductor substrate, it refers to a region ranging from the center to the lower surface in the depth direction of the semiconductor substrate.

In the present specification, a case where a term such as "same" or "equal" is mentioned may include a case where an error due to a variation in manufacturing or the like is included. The error is, for example, within 10%.

In the present specification, a conductivity type of doping region where doping has been carried out with an impurity is described as a P type or an N type. N type and P type are examples of the first conductivity type and the second conductivity type. N type may be the first conductivity type and P type may be the second conductivity type, or P type may be the first conductivity type and N type may be the second conductivity type. In the present specification, the impurity may particularly mean either a donor of the N type or an acceptor of the P type, and may be described as a dopant. In the present specification, doping means introducing the donor or the acceptor into the semiconductor substrate and turning it into a semiconductor presenting a conductivity type of the N type, or a semiconductor presenting conductivity type of the P type.

In the present specification, a doping concentration means a concentration of the donor or a concentration of the acceptor in a thermal equilibrium state. In the present specification, a net doping concentration means a net concentration obtained by adding the donor concentration set as a positive ion concentration to the acceptor concentration set as a negative ion concentration, taking into account of polarities of charges. As an example, when the donor concentration is $N_D$ and the acceptor concentration is $N_A$, the net doping concentration at any position is given as $|N_D-N_A|$.

The donor has a function of supplying electrons to a semiconductor. The acceptor has a function of receiving electrons from the semiconductor. The donor and the acceptor are not limited to the impurities themselves. For example, a VOH defect which is a combination of a vacancy (V), oxygen (O), and hydrogen (H) existing in the semiconductor functions as the donor that supplies electrons.

In the present specification, a description of a P+ type or an N+ type means a higher doping concentration than that of the P type or the N type, and a description of a P− type or an N− type means a lower doping concentration than that of the P type or the N type. Further, in the specification, a description of a P++ type or an N++ type means a higher doping concentration than that of the P+ type or the N+ type.

A chemical concentration in the present specification indicates an atomic density of an impurity measured regardless of an electrical activation state. The chemical concentration (atomic density) can be measured by, for example, secondary ion mass spectrometry (SIMS). The net doping concentration described above can be measured by voltage-capacitance profiling (CV profiling). Further, a carrier density measured by spreading resistance profiling (SRP method) may be set as the net doping concentration. The carrier density measured by the CV profiling or the SRP method may be a value in a thermal equilibrium state. Further, in a region of the N type, the donor concentration is sufficiently higher than the acceptor concentration, and thus the carrier density of the region may be set as the donor concentration. Similarly, in a region of the P type, the carrier density of the region may be set as the acceptor concentration.

Further, when a concentration distribution of the donor, acceptor, or net doping has a peak in a region, a value of the peak may be set as the concentration of the donor, acceptor, or net doping in the region. In a case where the concentration of the donor, acceptor or net doping is substantially uniform in a region, or the like, an average value of the concentration of the donor, acceptor or net doping in the region may be set as the concentration of the donor, acceptor or net doping.

The carrier density measured by the SRP method may be lower than the concentration of the donor or the acceptor. In a range where a current flows when a spreading resistance is measured, carrier mobility of the semiconductor substrate may be lower than a value in a crystalline state. The reduction in carrier mobility occurs when carriers are scattered due to disorder (disorder) of a crystal structure due to a lattice defect or the like.

The concentration of the donor or the acceptor calculated from the carrier density measured by the CV profiling or the SRP method may be lower than a chemical concentration of an element indicating the donor or the acceptor. As an example, in a silicon semiconductor, a donor concentration of phosphorous or arsenic serving as a donor, or an acceptor concentration of boron (boron) serving as an acceptor is approximately 99% of chemical concentrations of these. On the other hand, in the silicon semiconductor, a donor concentration of hydrogen serving as a donor is approximately 0.1% to 10% of a chemical concentration of hydrogen.

FIG. 1 illustrates an example of a top view of the semiconductor device 100. FIG. 1 illustrates a position at which each member is projected on an upper surface of a semiconductor substrate 10. FIG. 1 illustrates merely some members of the semiconductor device 100, and omits illustrations of some members.

The semiconductor device 100 includes the semiconductor substrate 10. The semiconductor substrate 10 is a substrate that is formed of a semiconductor material. As an example, the semiconductor substrate 10 is a silicon substrate. In the semiconductor substrate 10 of this example, bulk donors of N type are distributed throughout. The bulk donors are donors by dopants contained substantially uniformly in an ingot at the time of manufacturing the ingot that is a source of the semiconductor substrate 10. In this example, the bulk donor is an element other than hydrogen. The bulk donor dopant is, for example, Group V and Group VI elements, such as, but not limited to, phosphorous, antimony, arsenic, selenium or sulfur. In this example, the bulk donor is phosphorous. The bulk donors are also included in the P type region. The semiconductor substrate 10 may be a wafer cut out from a semiconductor ingot, or may be a chip obtained by singulating the wafer. The semiconductor ingot may be manufactured by any of a Czochralski method (CZ method), a magnetic-field applied Czochralski method (MCZ method), and a float zone method (FZ method).

The oxygen chemical concentration contained in the substrate manufactured by the MCZ method is $1\times10^{17}$ to $7\times10^{17}$ atoms/cm$^3$, as an example. The oxygen chemical concentration contained in the substrate manufactured by the FZ method is $1\times10^{15}$ to $5\times10^{16}$ atoms/cm$^3$, as an example. The bulk donor concentration may be a chemical concentration of bulk donors distributed throughout the semiconductor substrate 10, and may be a value between 90% and 100% of the chemical concentration. For semiconductor substrates doped with dopants of Group V such as phosphorous and Group VI, the bulk donor concentration may be $1\times10^{11}$/cm$^3$ or more and $3\times10^{13}$/cm$^3$ or less. For semiconductor substrates doped with dopants of Group V such as phosphorous and Group VI, the bulk donor concentration is preferably $1\times10^{12}$/cm$^3$ or more and $1\times10^{13}$/cm$^3$ or less. In addition, for the semiconductor substrate 10, a non-doped substrate in which bulk dopants such as phosphorous are not substantially contained may be used. In this case, the bulk donor concentration of the non-doped substrate is, for example, $1\times10^{10}$/cm$^3$ or more and $5\times10^{12}$/cm$^3$ or less. The bulk donor concentration of the non-doped substrate is preferably $1\times10^{11}$/cm$^3$ or more. The bulk donor concentration of the non-doped substrate is preferably $5\times10^{12}$/cm$^3$ or less.

Further, the bulk acceptors of P type may be distributed throughout the semiconductor substrate 10. The bulk acceptors may be acceptors by dopants contained substantially uniformly in an ingot at the time of manufacturing the ingot that is a source of the semiconductor substrate 10, or may be acceptors implanted into the entire wafer or chip-shaped semiconductor substrate 10. The bulk acceptor may be boron. The bulk acceptor concentration may be lower than the bulk donor concentration. That is, the bulk of the ingot or the semiconductor substrate 10 is N type. As an example, the bulk acceptor concentration is $5\times10^{11}$ (/cm$^3$) to $8\times10^{14}$ (/cm$^3$), and the bulk donor concentration is $5\times10^{12}$ (/cm$^3$) to $1\times10^{15}$ (/cm$^3$). The bulk acceptor concentration may be 1% or more, 10% or more, or 50% or more of the bulk donor concentration. The bulk acceptor concentration may be 99% or less, 95% or less, or 90% or less of the bulk donor concentration. For the bulk acceptor concentration and the bulk donor concentration, the chemical concentration of impurities such as boron, phosphorous or the like distributed throughout the semiconductor substrate 10 may be used. For the bulk acceptor concentration and the bulk donor concentration, a value at the center in the depth direction of the semiconductor substrate 10, of the chemical concentration of impurities such as boron, phosphorous or the like distributed throughout the semiconductor substrate 10 may be used.

The semiconductor substrate 10 has an upper surface and a lower surface. The upper surface and the lower surface are two principal surfaces of the semiconductor substrate 10. The semiconductor substrate 10 has an end side 102 in the top view. When merely referred to as the top view in the present specification, it means that the semiconductor substrate 10 is viewed from an upper surface side. The semiconductor substrate 10 of this example has two sets of end sides 102 opposite to each other in the top view. In FIG. 1, the X axis and the Y axis are parallel to any of the end sides 102. In addition, the Z axis is perpendicular to the upper surface of the semiconductor substrate 10.

The semiconductor substrate 10 is provided with an active portion 160. The active portion 160 is a region where a main current flows in the depth direction between the upper surface and a lower surface of the semiconductor substrate 10 when the semiconductor device 100 operates. An emitter electrode is provided above the active portion 160, but is omitted in FIG. 1.

The active portion 160 is provided with at least one of a transistor portion 70 including a transistor element such as an IGBT, and a diode portion 80 including a diode element such as a freewheeling diode (FWD). In the example of FIG. 1, the transistor portion 70 and the diode portion 80 are alternately arranged along a predetermined array direction (the X axis direction in this example) on the upper surface of the semiconductor substrate 10. The active portion 160 in another example may be provided with only one of the transistor portion 70 and the diode portion 80.

In FIG. 1, a region where each of the transistor portions 70 is arranged is indicated by a symbol "I", and a region where each of the diode portions 80 is arranged is indicated by a symbol "F". In the present specification, a direction perpendicular to the array direction in the top view may be referred to as an extending direction (the Y axis direction in FIG. 1). Each of the transistor portions 70 and the diode portions 80 may have a longitudinal length in the extending direction. In other words, the length of each of the transistor portions 70 in the Y axis direction is greater than the width in the X axis direction. Similarly, the length of each of the diode portions 80 in the Y axis direction is greater than the width in the X axis direction. The extending direction of the transistor portion 70 and the diode portion 80, and the longitudinal direction of each trench portion described later may be the same.

Each of the diode portions 80 includes a cathode region of N+ type in a region in contact with the lower surface of the semiconductor substrate 10. In the present specification, a region where the cathode region is provided is referred to as the diode portion 80. In other words, the diode portion 80 is a region that overlaps with the cathode region in the top view. On the lower surface of the semiconductor substrate 10, a collector region of P+ type may be provided in a region other than the cathode region. In the specification, the diode portion 80 may also include an extension region 81 where the diode portion 80 extends to a gate runner described below in the Y axis direction. The collector region is provided on a lower surface of the extension region 81.

The transistor portion 70 has the collector region of the P+ type in a region in contact with the lower surface of the semiconductor substrate 10. Further, in the transistor portion 70, an emitter region of the N+ type, a base region of the P– type, and a gate structure having a gate conductive portion and a gate dielectric film are periodically arranged on the upper surface side of the semiconductor substrate 10.

The semiconductor device 100 may have one or more pads above the semiconductor substrate 10. The semiconductor device 100 of this example has a gate pad 112. The semiconductor device 100 may have an anode pad and a cathode pad connected to a temperature detection diode, and may have a current detection pad. Each pad is arranged in a region close to the end side 102. The region close to the end side 102 refers to a region between the end side 102 and the emitter electrode in the top view. In implementation of the semiconductor device 100, each pad may be connected to an external circuit via a wiring such as a wire.

A gate potential is applied to the gate pad 112. The gate pad 112 is electrically connected to a conductive portion of a gate trench portion of the active portion 160. The semiconductor device 100 includes a gate runner that connects the gate pad 112 and the gate trench portion. In FIG. 1, the gate runner is hatched with diagonal lines.

The gate runner of this example has an outer circumferential gate runner 130 and an active-side gate runner 131. The outer circumferential gate runner 130 is arranged between the active portion 160 and the end side 102 of the semiconductor substrate 10 in the top view. The outer circumferential gate runner 130 of this example encloses the active portion 160 in the top view. A region enclosed by the outer circumferential gate runner 130 in the top view may be the active portion 160. Further, the outer circumferential gate runner 130 is connected to the gate pad 112. The outer circumferential gate runner 130 is arranged above the semiconductor substrate 10. The gate runner may be a metal wiring including aluminum or the like, may be a wiring formed of polysilicon, or may also be a stacked wiring where these wirings are stacked.

The active-side gate runner 131 is provided in the active portion 160. Providing the active-side gate runner 131 in the active portion 160 can reduce a variation in wiring length from the gate pad 112 for each region of the semiconductor substrate 10.

The active-side gate runner 131 is connected to the gate trench portion of the active portion 160. The active-side gate runner 131 is arranged above the semiconductor substrate 10. The active-side gate runner 131 may be a wiring formed of a semiconductor such as polysilicon doped with an impurity.

The active-side gate runner 131 may be connected to the outer circumferential gate runner 130. The active-side gate runner 131 of this example is provided extending in the X axis direction so as to cross the active portion 160 from one outer circumferential gate runner 130 to the other outer circumferential gate runner 130 substantially at the center of the Y axis direction. When the active portion 160 is divided by the active-side gate runner 131, the transistor portion 70 and the diode portion 80 may be alternately arranged in the X axis direction in each divided region.

Further, the semiconductor device 100 may include a temperature sensing portion (not shown) that is a PN junction diode formed of polysilicon or the like, and a current detection portion (not shown) that simulates an operation of the transistor portion provided in the active portion 160.

The semiconductor device 100 of this example includes an edge termination structure portion 90 between the active portion 160 and the end side 102. The edge termination structure portion 90 is provided farther outward than the active portion 160 on the semiconductor substrate 10. The description "outward" for the semiconductor substrate 10 refers to a side closer to the end side 102. The edge termination structure portion 90 of this example is arranged between the outer circumferential gate runner 130 and the end side 102. The edge termination structure portion 90 reduces an electric field strength on the upper surface side of the semiconductor substrate 10. The edge termination structure portion 90 has a plurality of guard rings 92. The guard ring 92 is a region of P type in contact with the upper surface of the semiconductor substrate 10. The guard ring 92 may be configured to enclose the active portion 160, as seen from above. The plurality of guard rings 92 are arranged at predetermined intervals between the outer circumferential gate runner 130 and the end side 102. The guard ring 92 arranged on the outer side may be configured to enclose the guard ring 92 arranged on one inner side. The outer side refers to a side close to the end side 102, and the inner side refers to a side close to the center of the semiconductor substrate 10, as seen from above. By providing the plurality of guard rings 92, a depletion layer on the upper surface side of the active portion 160 can be extended outward, so that the breakdown voltage of the semiconductor device 100 can be improved. The edge termination structure portion 90 may further include at least one of a field plate and RESURF which are annularly provided to enclose the active portion 160.

Figure 2:
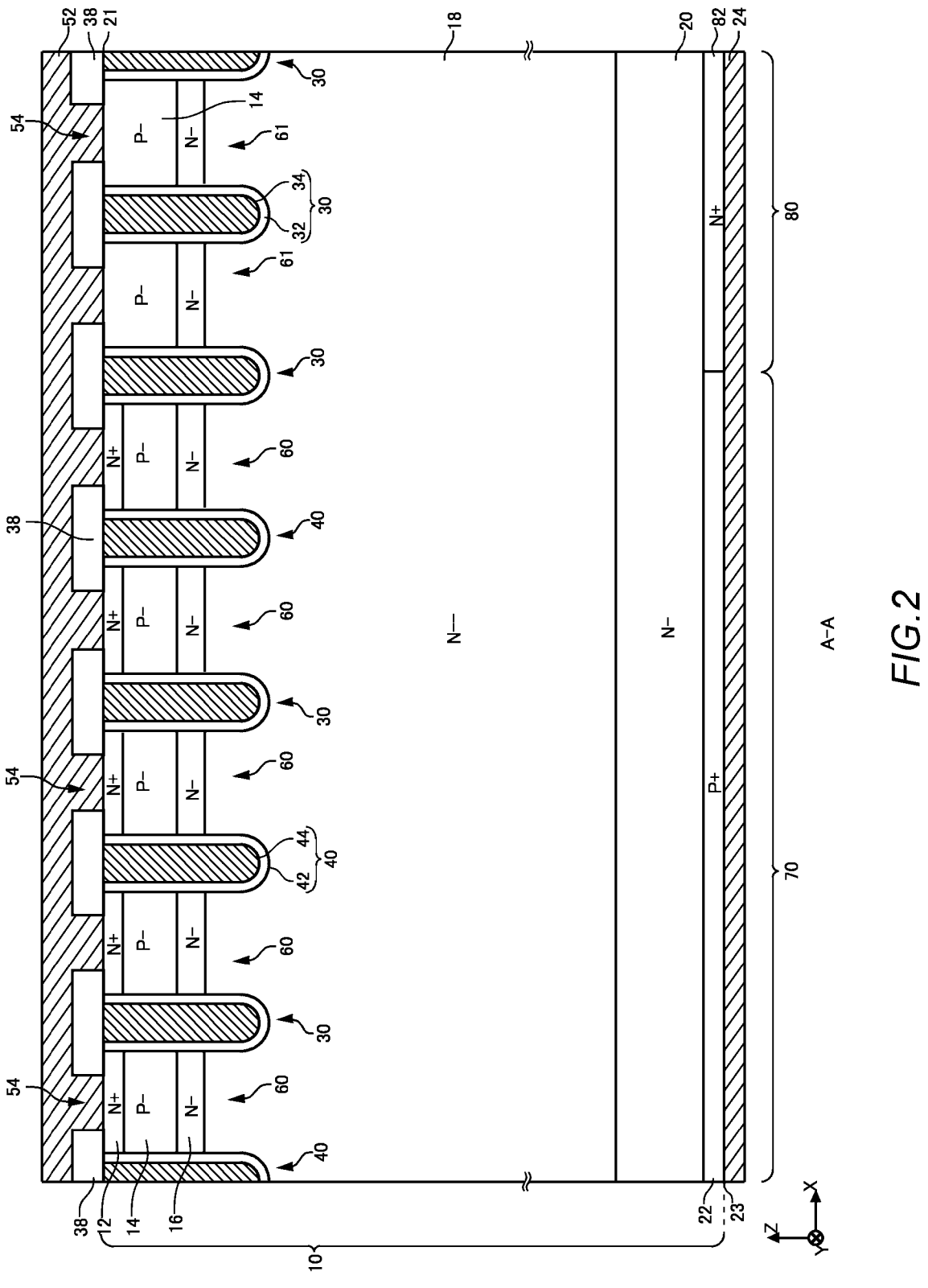
FIG. 2 illustrates an example of an A-A cross section in FIG. 1.

FIG. 2 illustrates an example of an A-A cross section in FIG. 1. The A-A cross section is an XZ plane passing the transistor portion 70 and the diode portion 80. In the cross section, the semiconductor device 100 of this example has the semiconductor substrate 10, an interlayer dielectric film 38, an emitter electrode 52 and a collector electrode 24. The interlayer dielectric film 38 is provided on the upper surface 21 of the semiconductor substrate 10. The interlayer dielectric film 38 is a film including at least one layer of a dielectric film such as silicate glass added with impurities of boron, phosphorous or the like, a thermal oxide film, a nitride film and other dielectric film. The interlayer dielectric film 38 is provided with a contact hole 54 for connecting the emitter electrode 52 and the semiconductor substrate 10 each other.

The emitter electrode 52 is provided above the interlayer dielectric film 38. The emitter electrode 52 is in contact with the upper surface 21 of the semiconductor substrate 10 through the contact hole 54 in the interlayer dielectric film 38. The emitter electrode 52 may be in contact with an emitter region 12, a contact region and a base region 14, which will be described later. The collector electrode 24 is provided on the lower surface 23 of the semiconductor substrate 10. The emitter electrode 52 and the collector electrode 24 are formed of a metal material such as aluminum. As used herein, a direction (Z axis direction) in which the emitter electrode 52 and the collector electrode 24 are connected to each other is referred to as 'depth direction'.

The semiconductor substrate 10 has a drift region 18 of N− type. A doping concentration in the drift region 18 may be the same as the bulk donor concentration or may be the same as a bulk net doping concentration, which is a difference between the bulk donor concentration and the bulk acceptor concentration. In another example, the doping concentration in the drift region 18 may be higher than the bulk donor concentration or the bulk net doping concentration. The drift region 18 is provided in each of the transistor portion 70 and the diode portion 80.

One or more gate trench portions 40 and dummy trench portions 30 are provided on the upper surface side of the semiconductor substrate 10. The gate trench portion 40 is applied with a gate voltage and functions as a gate electrode, and the dummy trench portion 30 is not applied with a gate voltage and does not function as a gate electrode. As used herein, the gate trench portion 40 and the dummy trench portion 30 may be referred to as a trench portion. The trench portion is provided in the depth direction from the upper surface 21 of the semiconductor substrate 10 to the drift region 18. In addition, the trench portion is extended in the extending direction (Y axis direction) on the upper surface 21 of the semiconductor substrate 10.

Each of the transistor portion 70 and the diode portion 80 includes a plurality of trench portions arranged in the array direction. In the transistor portion 70 of this example, one or more gate trench portions 40 and one or more dummy trench portions 30 are alternately provided along the array direction. In the diode portion 80 of this example, the plurality of dummy trench portions 30 are provided along the array direction. In the diode portion 80 of this example, the gate trench portion 40 is not provided.

A mesa portion is provided between the respective trench portions in the array direction. The mesa portion refers to a region sandwiched between the trench portions inside the semiconductor substrate 10. As an example, an upper end of the mesa portion is the upper surface of the semiconductor substrate 10. The depth position of the lower end of the mesa portion is the same as the depth position of the lower end of the trench portion. The mesa portion of this example is provided extending in the extending direction (the Y axis direction) along the trench, on the upper surface of the semiconductor substrate 10. In this example, a mesa portion 60 is provided in the transistor portion 70, and a mesa portion 61 is provided in the diode portion 80. In the case of simply mentioning "mesa portion" in the present specification, the portion refers to each of the mesa portion 60 and the mesa portion 61.

In the mesa portion 60 of the transistor portion 70, an N+ type of emitter region 12 and a P− type of base region 14 are provided in order from an upper surface 21 side of the semiconductor substrate 10. The drift region 18 is provided below the base region 14. The mesa portion 60 may be provided with an N− type of accumulation region 16. The accumulation region 16 is arranged between the base region 14 and the drift region 18.

The emitter region 12 is exposed on the upper surface 21 of the semiconductor substrate 10 and is provided in contact with gate trench portion 40. The emitter region 12 may be in contact with the trench portions on both sides of the mesa portion 60. The emitter region 12 has a higher doping concentration than the drift region 18.

The base region 14 is provided below the emitter region 12. The base region 14 of this example is provided in contact with the emitter region 12. The base region 14 may be in contact with the trench portions on both sides of the mesa portion 60.

The accumulation region 16 is provided below the base region 14. The accumulation region 16 is an N− type region with a higher doping concentration than the drift region 18.

By providing the accumulation region 16 having the high concentration between the drift region 18 and the base region 14, it is possible to improve a carrier injection enhancement effect (IE effect) and reduce an on-voltage. The accumulation region 16 may be provided to cover a whole lower surface of the base region 14 in each mesa portion 60.

The mesa portion 61 of the diode portion 80 is provided with the P− type of base region 14 in contact with the upper surface 21 of the semiconductor substrate 10. The drift region 18 is provided below the base region 14. In the mesa portion 61, the accumulation region 16 may be provided below the base region 14.

At least one of the mesa portion 60 and the mesa portion 61 may be provided with a contact region of P+ type exposed on the upper surface 21 of the semiconductor substrate 10. For example, in the mesa portion 60, the contact region and the emitter region 12 may be alternately arranged along the Y axis direction.

In each of the transistor portion 70 and the diode portion 80, an N− type buffer region 20 may be provided on the lower surface 23 side with respect to the drift region 18. The doping concentration of the buffer region 20 is higher than the doping concentration of the drift region 18. The buffer region 20 has one or a plurality of donor concentration peaks having a higher donor concentration than the donor concentration of the drift region 18. The buffer region 20 may function as a field stopper layer which prevents a depletion layer expanding from the lower end of the base region 14 from reaching the collector region of the P+ type 22 and the cathode region 82 of the N+ type.

In the transistor portion 70, the collector region of the P+ type 22 is provided below the buffer region 20. An acceptor concentration of the collector region 22 is higher than an acceptor concentration of the base region 14. The collector region 22 may include an acceptor which is the same as or different from an acceptor of the base region 14. The acceptor of the collector region 22 is, for example, boron.

Below the buffer region 20 in the diode portion 80, the cathode region 82 of the N+ type is provided. A donor concentration of the cathode region 82 is higher than a donor concentration of the drift region 18. A donor of the cathode region 82 is, for example, hydrogen or phosphorous. Note that an element serving as a donor and an acceptor in each region is not limited to the above described example. The collector region 22 and the cathode region 82 are exposed on the lower surface 23 of the semiconductor substrate 10 and are connected to the collector electrode 24. The collector electrode 24 may be in contact with the entire lower surface 23 of the semiconductor substrate 10. The emitter electrode 52 and the collector electrode 24 are formed of a metal material such as aluminum.

Each trench portion passes through the base region 14 from the upper surface 21 of the semiconductor substrate 10, and reaches the drift region 18. In a region where at least any one of the emitter region 12, the contact region, and the accumulation region 16 is provided, each trench portion also passes through the doping regions of these to reach the drift region 18. The configuration of the trench portion penetrating the doping region is not limited to the one manufactured in the order of forming the doping region and then forming the trench portion. The configuration of the trench portion penetrating the doping region includes a configuration of the doping region being formed between the trench portions after forming the trench portion.

As described above, the transistor portion 70 is provided with the gate trench portion 40 and the dummy trench portion 30. In the diode portion 80, the dummy trench portion 30 is provided, and the gate trench portion 40 is not provided. The boundary in the X axis direction between the diode portion 80 and the transistor portion 70 in this example is the boundary between the cathode region 82 and the collector region 22.

The gate trench portion 40 includes a groove-shaped gate trench provided in the upper surface 21 of the semiconductor substrate 10, a gate dielectric film 42, and a gate conductive portion 44. The gate trench portion 40 is an example of the gate structure. The gate dielectric film 42 is provided to cover the inner wall of the gate trench. The gate dielectric film 42 may be formed by oxidizing or nitriding a semiconductor on the inner wall of the gate trench. The gate conductive portion 44 is provided on an inner side with respect to the gate dielectric film 42 in the gate trench. That is, the gate dielectric film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered by the interlayer dielectric film 38 on the upper surface 21 of the semiconductor substrate 10. The gate conductive portion 44 is electrically connected to the gate runner. When a predetermined gate voltage is applied to the gate conductive portion 44, a channel is formed by an electron inversion layer in a surface layer of the base region 14 at a boundary in contact with the gate trench portion 40.

The dummy trench portions 30 may have the same structure as the gate trench portions 40 in the cross section. The dummy trench portion 30 includes a dummy trench provided in the upper surface 21 of the semiconductor substrate 10, a dummy dielectric film 32, and a dummy conductive portion 34. The dummy conductive portion 34 may be connected to an electrode different from the gate pad. For example, the dummy conductive portion 34 may be connected to a dummy pad (not shown) that connects to an external circuit different from the gate pad and may be subjected to a control different from that of the gate conductive portion 44. In addition, the dummy conductive portion 34 may also be electrically connected to the emitter electrode 52. The dummy dielectric film 32 is provided covering an inner wall of the dummy trench. The dummy conductive portion 34 is provided in the dummy trench, and is provided on an inner side with respect to the dummy dielectric film 32. The dummy dielectric film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon or the like. The dummy conductive portion 34 may have the same length as the gate conductive portion 44 in the depth direction.

In the cross section, the gate trench portion 40 and the dummy trench portion 30 are covered with the interlayer dielectric film 38 on the upper surface 21 of the semiconductor substrate 10. As described above, the gate trench portion 40 may be connected to the gate runner at any location, and the dummy trench portion 30 may be connected to the emitter electrode 52 at any location.

Figure 3:
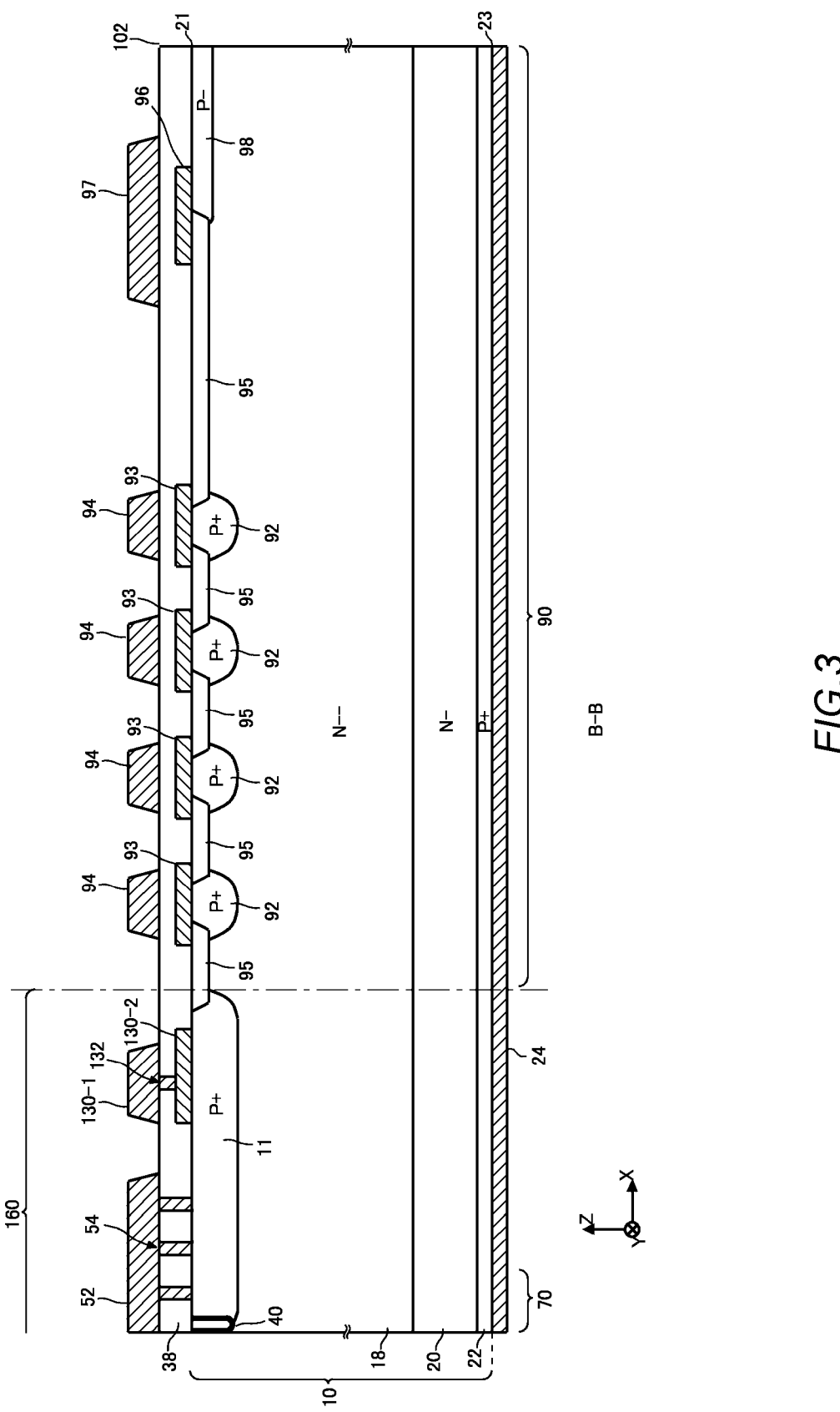
FIG. 3 illustrates an example of a B-B cross section in FIG. 1.

FIG. 3 illustrates an example of a B-B cross section in FIG. 1. The B-B cross section is an XZ plane passing through the outer circumferential gate runner 130 and the edge termination structure portion 90. In FIG. 3, a part of the transistor portion 70 in the vicinity of the outer circumferential gate runner 130 is also shown.

The outer circumferential gate runner 130 is arranged above the upper surface 21 of the semiconductor substrate 10. In this example, an outer circumferential gate runner 130-1 and an outer circumferential gate runner 130-2 are stacked and arranged in the Z axis direction. The outer circumferential gate runner 130-1 is formed of a metal material such as aluminum, and the outer circumferential gate runner 130-2 is formed of polysilicon doped with impurities.

Note that, the outer circumferential gate runner 130-2 and the semiconductor substrate 10 are insulated by a dielectric film such as a thermal oxide film, which is however omitted in FIG. 3. The outer circumferential gate runner 130-2 is connected to the gate conductive portion 44 at any position.

The outer circumferential gate runner 130-1 is arranged above the outer circumferential gate runner 130-2. The interlayer dielectric film 38 is arranged between the outer circumferential gate runner 130-1 and the outer circumferential gate runner 130-2. The interlayer dielectric film 38 is provided with a contact hole 132 for connecting the outer circumferential gate runner 130-1 and the outer circumferential gate runner 130-2. The contact hole 132 may be provided to enclose the active portion 160 along the outer circumferential gate runner 130. The outer circumferential gate runner 130-1 is connected to the outer circumferential gate runner 130-2 through the contact hole 132.

A well region 11 is provided in the semiconductor substrate 10 below the outer circumferential gate runner 130. The well region 11 is provided from the upper surface 21 of the semiconductor substrate 10 to a position deeper than the base region 14. The well region 11 is preferably provided to a position deeper than the trench portion. The well region 11 is a region of P+ type having a higher concentration than that of the base region 14. The interlayer dielectric film 38 may be formed between the emitter electrode 52 and the well region 11. The well region 11 may be connected to the emitter electrode 52 via one or more contact holes 54 formed in the interlayer dielectric film 38. That is, the well region 11 may be electrically connected to the emitter electrode 52.

The well region 11 is provided overlapping the outer circumferential gate runner 130. The well region 11 may be provided extending with a predetermined width even in a range that does not overlap the outer circumferential gate runner 130. In addition, the well region 11 may be provided to enclose the active portion 160 along the outer circumferential gate runner 130. The well region 11 may also be arranged below the active-side gate runner 131. By providing the well region 11, a depletion layer expanding from the active portion 160 can be easily extended to the edge termination structure portion 90, so that breaking in the active portion 160 can be suppressed.

The edge termination structure portion 90 has the plurality of guard rings 92 and a plurality of embedded dielectric films 95. The edge termination structure portion 90 of this example further has a plurality of field plates 93, a plurality of field electrodes 94, an outer electrode 97, an outer plate 96, and a channel stopper 98. The edge termination structure portion 90 may be a region on an outer circumference side with respect to an outer circumferential-side end portion of the well region 11.

The guard ring 92 is a region of P+ type provided in contact with the upper surface 21 of the semiconductor substrate 10. As shown in FIG. 1, each guard ring 92 is configured to enclose the active portion 160. The active portion 160 may be a region on an inner circumferential side with respect to the outer circumferential-side end portion of the well region 11. A lower end of the guard ring 92 may be arranged on the lower surface 23 side with respect to a lower end of the base region 14. The lower end of the guard ring 92 may be arranged on the lower surface 23 side with respect to a lower end of the trench portion. The lower end of the guard ring 92 may be arranged on the lower surface 23 side with respect to a lower end of the well region 11, may be arranged on the upper surface 21 side with respect to the lower end of the well region 11, or may be arranged at the same depth position as the lower end of the well region 11. In this example, the lower end of the guard ring 92 is arranged at the same depth position as the lower end of the well region 11.

Each embedded dielectric film 95 is arranged between the two guard rings 92. The embedded dielectric film 95 may be provided to enclose the active portion 160 along the guard ring 92. The embedded dielectric film 95 may also be provided between the outermost circumferential guard ring 92 and the channel stopper 98. The embedded dielectric film 95 may also be provided between the innermost circumferential guard ring 92 and the well region 11.

At least a part of the embedded dielectric film 95 is embedded in the semiconductor substrate 10. That is, at least a part of the embedded dielectric film 95 is arranged below the upper surface 21 of the semiconductor substrate 10. The upper surface 21 of the semiconductor substrate 10 may refer to the uppermost surface among surfaces of a semiconductor material such as silicon. In the embedded dielectric film 95, a thickness of the portion below the upper surface 21 of the semiconductor substrate 10 may be larger than a thickness of a portion above the upper surface 21. The entire embedded dielectric film 95 may be provided at the same position as or below the upper surface 21 of the semiconductor substrate 10. In this example, an upper surface of the embedded dielectric film 95 is at the same position as the upper surface 21 of the semiconductor substrate 10, and the entire embedded dielectric film 95 is provided below the upper surface 21 from the same position as the upper surface 21 of the semiconductor substrate 10.

The embedded dielectric film 95 may have a dielectric film obtained by oxidizing or nitriding the semiconductor substrate 10, may have a dielectric film deposited by a CVD or the like, or may also have another dielectric film. The embedded dielectric film 95 may be a single-layer dielectric film, or may be a dielectric film in which a plurality of films formed by different methods are stacked. In this example, the embedded dielectric film 95 is a LOCOS film formed by forming a recess on the upper surface 21 of the semiconductor substrate 10 and thermally oxidizing the semiconductor material exposed to the recess.

By providing the embedded dielectric film 95, it is possible to prevent the semiconductor substrate 10 from being exposed between the guard rings 92. That is, it is possible to prevent the semiconductor substrate 10 between the guard rings 92 from coming into contact with a conductive member. In addition, by arranging at least a part of the embedded dielectric film 95 in the semiconductor substrate 10, the unevenness on the upper surface 21 of the semiconductor substrate 10 can be reduced. This makes it easier to form a member to be arranged above the upper surface 21 of the semiconductor substrate 10. For example, since a step of the field plate 93 can be reduced, the field plate 93 can be easily formed.

In this example, the field plate 93 is formed of polysilicon added with impurities. The field plate 93 is arranged above the guard ring 92. The field plate 93 is arranged to cover at least a part of the guard ring 92. The field plate 93 may also be arranged to cover the entire guard ring 92. The field plate 93 may be provided extending to a position where it does not overlap the guard ring 92. A dielectric film such as a thermal oxide film may be provided between the field plate 93 and the semiconductor substrate 10. In another example, the field plate 93 and the guard ring 92 may be in contact with each other as shown in FIG. 3.

Figure 9:
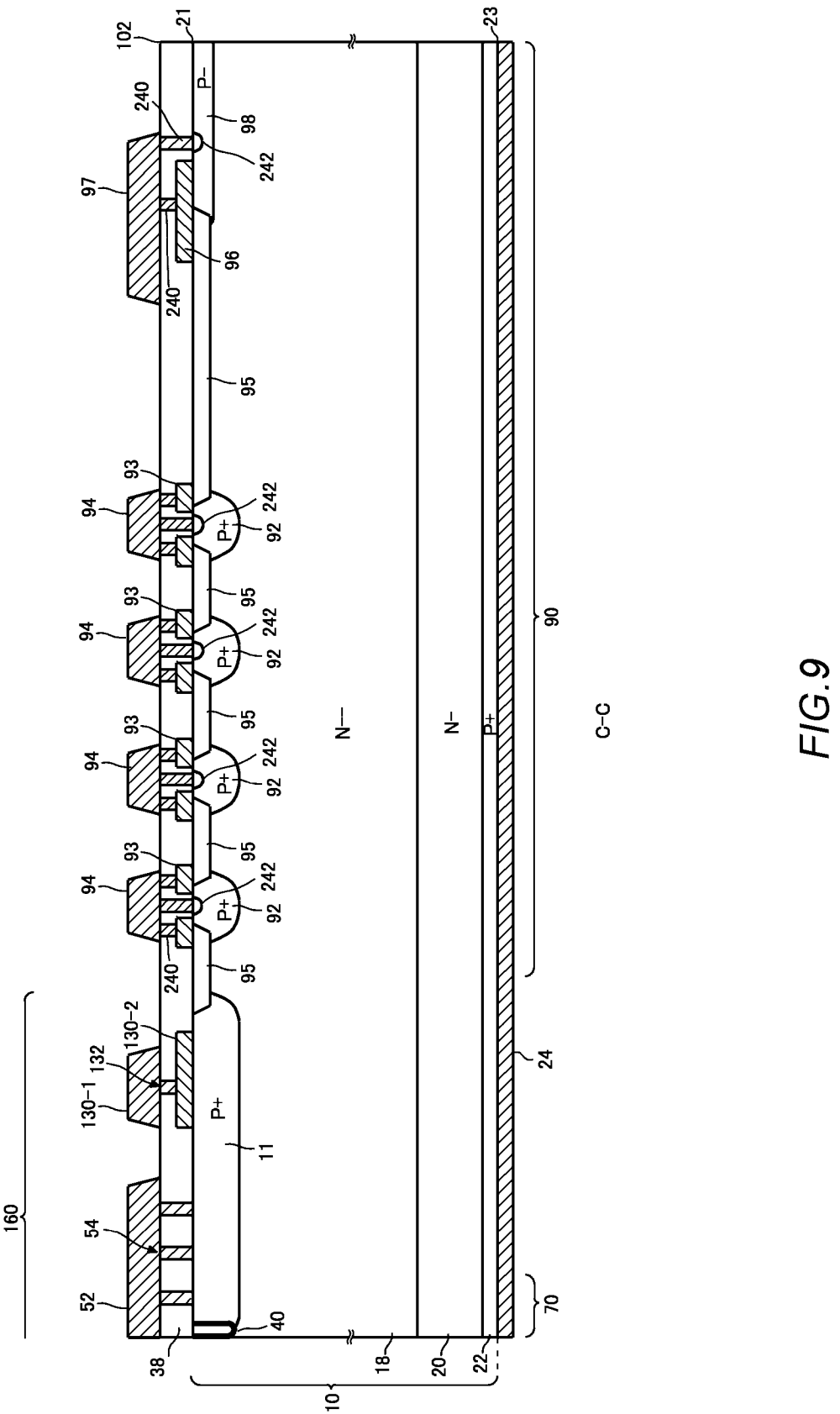
FIG. 9 illustrates an example of a C-C cross section in FIG. 1.

In this example, the field electrode 94 is formed of a metal material such as aluminum. The field electrode 94 is arranged above the field plate 93. The interlayer dielectric film 38 is arranged between the field electrode 94 and the field plate 93. The field electrode 94 and the field plate 93 are connected via a contact hole provided in the interlayer dielectric film 38. The cross section shown in FIG. 3 does not show the contact hole. However, in another cross section, the contact hole is provided in the interlayer dielectric film 38. For example, as shown in FIG. 9 which will be described later, a C-C cross section of FIG. 1 illustrates the contact hole provided in the interlayer dielectric film 38 in the vicinity of a corner portion of the semiconductor substrate 10. In addition, the interlayer dielectric film 38 is provided with a contact hole for connecting the field electrode 94 and the guard ring 92. The contact hole may also be provided in the vicinity of the corner portion of the semiconductor substrate 10. Each field electrode 94 is electrically floating. For example, when a voltage $V_{CE}$ is applied to the collector electrode 24 in a state where a gate of the semiconductor device 100 is off, a predetermined voltage lower than the voltage $V_{CE}$ is applied to each field electrode 94.

The channel stopper 98 is provided in contact with the end side 102 and the upper surface 21 of the semiconductor substrate 10. The channel stopper 98 is of P type having a concentration equal to or higher than that of the base region 14, or is of N type having a higher concentration than that of the drift region 18. The outer plate 96 is arranged above the channel stopper 98 and is electrically connected to the channel stopper 98. The outer plate 96 is formed of poly-silicon added with impurities. The outer plate 96 and the channel stopper 98 may be provided on a dielectric film (not shown), may be connected via a contact hole provided in the dielectric film, or may be in direct contact with each other. The channel stopper 98 may be connected to the outer electrode 97 via a contact hole.

The outer electrode 97 is arranged above the outer plate 96. The outer electrode 97 is formed of a metal material such as aluminum. The interlayer dielectric film 38 is provided between the outer electrode 97 and the outer plate 96. The outer electrode 97 and the outer plate 96 are connected via a contact hole provided in the interlayer dielectric film 38. The contact hole may be provided in the vicinity of the corner portion of the semiconductor substrate 10. A prede-termined voltage is applied to the outer electrode 97. A potential of the channel stopper 98 is a potential of the collector electrode 24. By setting the potential of the channel stopper 98 to the potential of the collector electrode 24, the depletion layer extending from the active portion 160 is suppressed from expanding by the outer electrode 97 and is prevented from reaching a side surface of the semiconductor substrate 10. This improves the breakdown voltage of the semiconductor device 100. Note that, the outer plate 96 may also be omitted. In this case, the channel stopper 98 is connected to the outer electrode 97 via a contact hole provided in the interlayer dielectric film 38.

Figure 4:
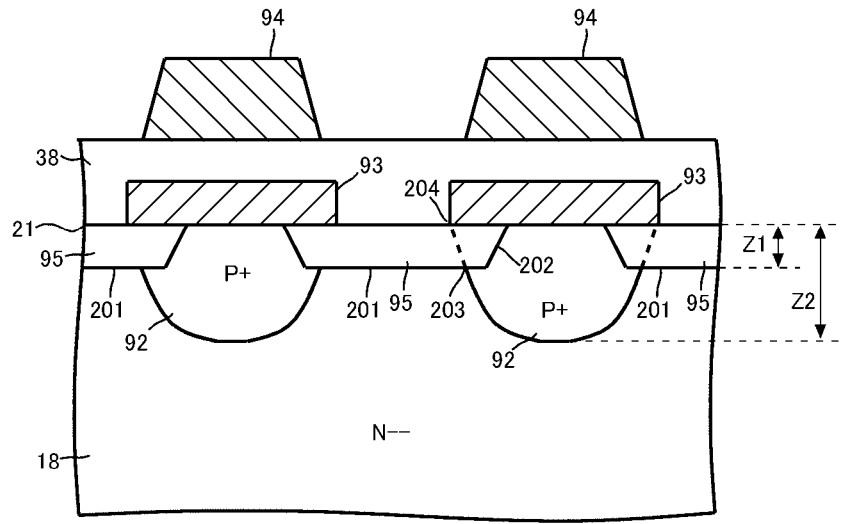
FIG. 4 illustrates an enlarged view of a vicinity of a guard ring 92 and an embedded dielectric film 95.
Figure 4:
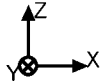

FIG. 4 is an enlarged view of a vicinity of the guard ring 92 and the embedded dielectric film 95. The guard ring 92 is provided up to a position below the embedded dielectric film 95. That is, an end portion 203 of the guard ring 92 (end portion in the X axis direction in FIG. 4) overlaps the embedded dielectric film 95 below the embedded dielectric film 95. A distance in the Z axis direction between the upper surface 21 of the semiconductor substrate 10 and the lower end of the embedded dielectric film 95 is denoted as Z1, and a distance in the Z axis direction between the upper surface 21 of the semiconductor substrate 10 and the lower end of the guard ring 92 is denoted as Z2. The distance Z2 is greater than the distance Z1. The distance Z2 may be 1.5 times or more, 2 times or more, or 3 times or more of the distance Z1. On the other hand, a difference (Z2–Z1) between the dis-tance Z2 and the distance Z1 may be smaller than the distance Z1. This can reduce the electric field strength and improves the breakdown voltage.

By providing the embedded dielectric film 95 between the guard rings 92, the diffusion of ions such as phosphorous forming the guard ring 92 on the XY plane is suppressed by the embedded dielectric film 95, so that a width of each guard ring 92 (width in the X axis direction, in the example of FIG. 3) becomes smaller. For example, when impurity ions are implanted and a heat treatment is performed at a depth position shallower than the embedded dielectric film 95 between the two embedded dielectric films 95, at least a part of the impurities is diffused to a position deeper than the embedded dielectric film 95 and is then diffused in the X axis direction. For this reason, the diffusion of impurities in the X axis direction is suppressed.

In addition, by providing the embedded dielectric film 95, the end portion 203 of the guard ring 92 is not exposed on the upper surface 21 and is in contact with the embedded dielectric film 95. As a comparative example, the guard ring 92 in a case where there is no embedded dielectric film 95 is shown by a broken line. In the case where there is no embedded dielectric film 95, an end portion 204 of the guard ring 92 is exposed on the upper surface 21. As shown in FIG. 4, by providing the embedded dielectric film 95, the end portion 203 of the guard ring 92 in the X axis direction can be arranged below the upper surface 21 of the semiconduc-tor substrate 10. Since the width of the guard ring 92 becomes larger as it is closer to the upper surface 21 of the semiconductor substrate 10, the width of the guard ring 92 in the X axis direction can be reduced by arranging the end portion 203 below the upper surface 21. An amount of reduction in the width of the guard ring 92 can be adjusted by the thickness Z1 of the embedded dielectric film 95.

By reducing the width of the guard ring 92, an interval between the guard rings 92 can be designed to be small while maintaining the breakdown voltage, so that the width of the edge termination structure portion 90 can be reduced. Thereby, the semiconductor device 100 can be made small. That is, according to the semiconductor device 100, by providing the embedded dielectric film 95, the flatness of the upper surface 21 of the semiconductor substrate 10 can be improved, and the semiconductor device 100 can be made small on the XY plane.

In this example, the embedded dielectric film 95 has a flat portion 201 and an end portion 202. The flat portion 201 is a region including the lower end of the embedded dielectric film 95 and having a substantially constant depth. The flat portion 201 may be a region, which has a depth of 0.5×Z1 or more, 0.7×Z1 or more, or 0.9×Z1 or more, of the embedded dielectric film 95. The end portion 202 is a region arranged farther outward than the flat portion 201 and having a smaller depth than that of the flat portion 201. The end portion 202 may include a portion whose depth gradu-ally decreases outward. The end portion 203 of the guard ring 92 may be in contact with the flat portion 201. This makes it possible to suppress variation in the width of the guard ring 92.

The depth Z1 from the upper surface 21 of the semiconductor substrate 10 to the lower end of the embedded dielectric film 95 may be 0.3 μm or more. By increasing the depth Z1, the width of the guard ring 92 can be reduced. The depth Z1 may be 1 μm or more, or may be 2 μm or more. If the depth Z1 is made too large, it becomes difficult to form the embedded dielectric film 95 flat. The depth Z1 may be 3 μm or less, may be 2 μm or less, or may be 1 μm or less.

Figure 5:
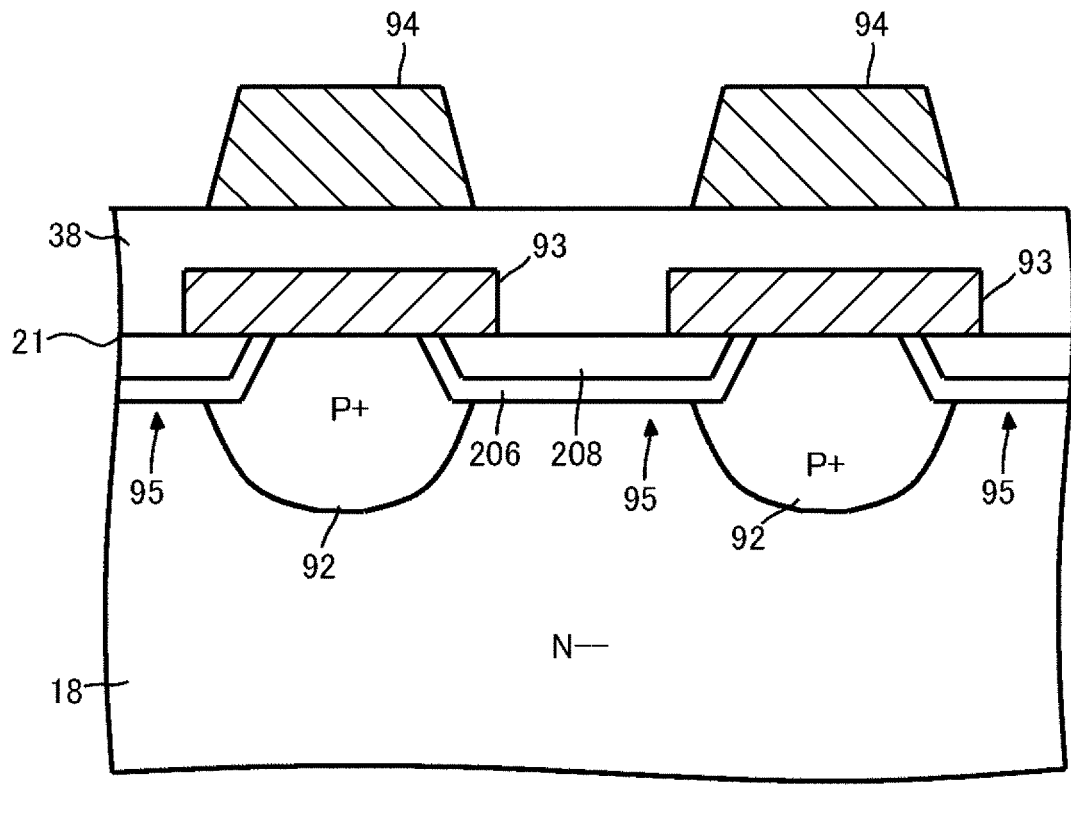
FIG. 5 illustrates another configuration example of the embedded dielectric film 95.

FIG. 5 illustrates another configuration example of the embedded dielectric film 95. The embedded dielectric film 95 of this example has a first dielectric film 206 and a second dielectric film 208. The first dielectric film 206 is in contact with the semiconductor substrate 10. The first dielectric film 206 is, for example, a film obtained by oxidizing or nitriding the semiconductor substrate 10. The second dielectric film 208 is stacked on the first dielectric film 206. The second dielectric film 208 is, for example, a deposited film formed by a CVD method. Since the embedded dielectric film 95 has a stacked structure, the embedded dielectric film 95 having the large thickness Z1 can be easily formed. Therefore, the width of the guard ring 92 can be easily reduced.

Figure 6:
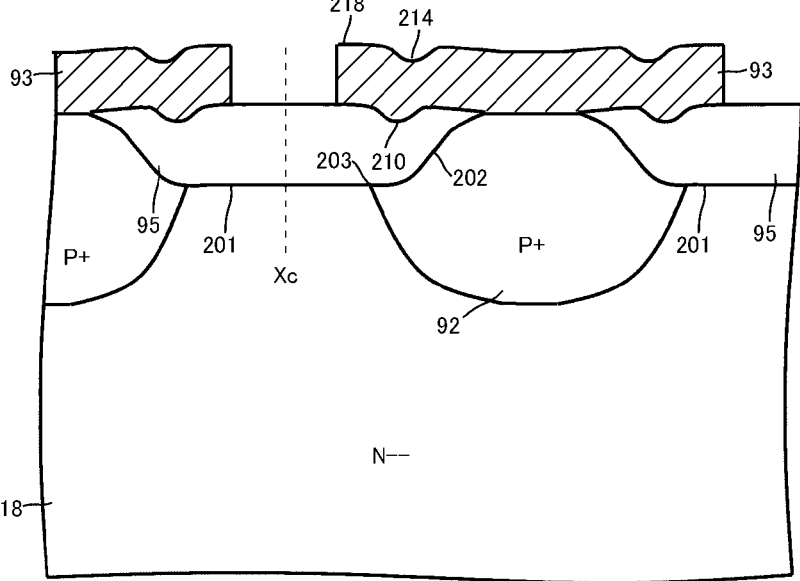
FIG. 6 illustrates a shape example of the embedded dielectric film 95 and a field plate 93.
Figure 6:
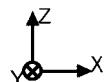

FIG. 6 illustrates a shape example of the embedded dielectric film 95 and the field plate 93. When a recess is formed on the upper surface 21 of the semiconductor substrate 10 and the recess is thermally oxidized to form the embedded dielectric film 95, a valley portion 210 may be formed on an upper surface of the embedded dielectric film 95. The valley portion 210 is a portion recessed downward. For example, the valley portion 210 may be formed by a portion where the dielectric film growing from a bottom surface of the recess and the dielectric film growing from a side surface intersect. At least a part of the valley portion 210 may be formed on an upper surface of the end portion 202 of the embedded dielectric film 95.

The field plate 93 of this example has a valley portion 214 at a position where the former overlaps the embedded dielectric film 95. The valley portion 214 is a portion provided on an upper surface of the field plate 93 and recessed toward the upper surface 21 of the semiconductor substrate 10. The field plate 93 of this example has an extension portion 218 extending toward a position closer to a center (position Xc in this example) of the embedded dielectric film 95 than the valley portion 214. The position Xc is the center of the embedded dielectric film 95 in a radial direction (X axis direction in FIG. 6) of the embedded dielectric film 95 enclosing the active portion 160. The extension portion 218 may be extended to the position Xc side with respect to the valley portion 210.

The extension portion 218 of any field plate 93 may also be extended beyond the position Xc. For example, the extension portion 218 including an end portion of the field plate 93 on the active portion 160 side may be extended beyond the position Xc.

Figure 7:
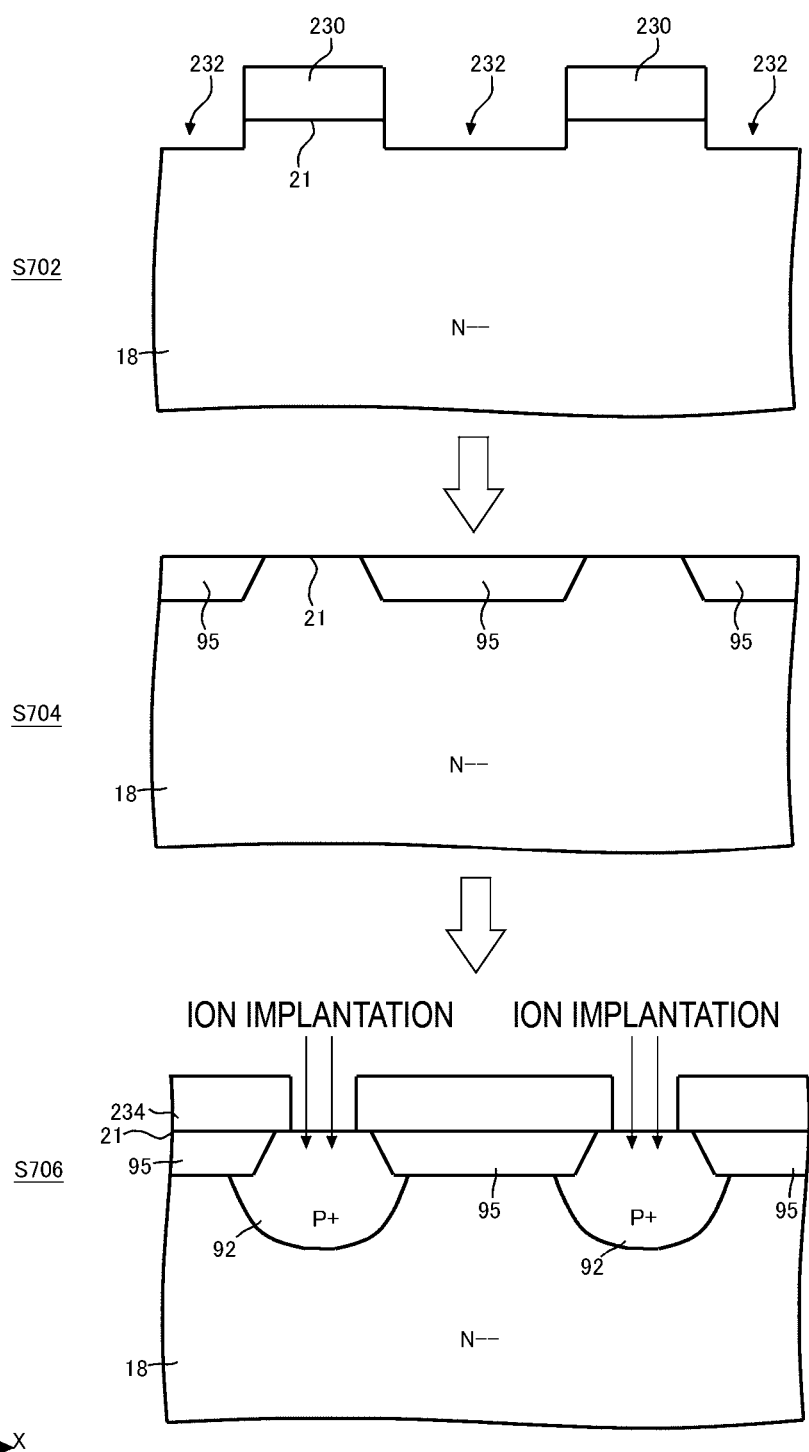
FIG. 7 illustrates a part of processes in a manufacturing method of the semiconductor device 100.

FIG. 7 illustrates a part of processes in a manufacturing method of the semiconductor device 100. In a recess forming step S702, a recess 232 is formed on the upper surface 21 of the semiconductor substrate 10. The recess 232 is formed between regions of the edge termination structure portion 90 where the two guard rings 92 are to be formed. In the example of FIG. 7, a mask 230 is selectively formed on the upper surface 21 of the semiconductor substrate 10 and the recess 232 is formed on the upper surface 21 of the semiconductor substrate 10 not covered with the mask 230. The mask 230 may include at least one of an oxide film, a nitride film and a resist film. In this example, after an initial oxide film is formed on the upper surface 21 of the semiconductor substrate 10, a nitride film is formed by a CVD method. A photoresist is applied on the nitride film and exposed in a predetermined pattern. After the exposure, the photoresist, the nitride film and the initial oxide film are selectively removed to form the mask 230.

Next, in a dielectric film forming step S704, the upper surface 21 of the semiconductor substrate 10 is oxidized. In S704, the upper surface 21 of the semiconductor substrate 10 is oxidized in a state where the mask 230 remains. Since the oxidizing of the upper surface 21 of the semiconductor substrate 10 is not progressed in the portion covered with the mask 230, the embedded dielectric film 95 can be selectively formed in the recess 232. After forming the embedded dielectric film 95, the mask 230 is removed. An upper end of the embedded dielectric film 95 is preferably at the same height position as the upper surface 21 of the semiconductor substrate 10 but is not limited thereto.

Next, in an implantation step S706, ions of P type dopant are implanted into the upper surface 21 of the semiconductor substrate 10. The P type dopant is, for example, boron. In S706, ions are implanted in a state where a mask 234 is formed on the upper surface 21 of the semiconductor substrate 10. The mask 234 has an opening in a region where the guard ring 92 is to be formed. In this example, the ions are implanted between the two embedded dielectric films 95. This makes it possible to selectively implant the ions into the region where the guard ring 92 is to be formed. After implanting the ions, the semiconductor substrate 10 is annealed to form the guard ring 92. The annealing temperature may be 1000 degrees C. or higher and 1200 degrees C. or lower. The annealing time may be 1 hour or more and 12 hours or less. By performing the annealing at a high temperature for a long time, the guard ring 92 protruding up to a position below the embedded dielectric film 95 can be formed.

Note that, a depth at which the P type dopant is implanted in S706 may be on the upper surface 21 side with respect to the lower end of the embedded dielectric film 95. By implanting the P type dopant to a position shallower than the embedded dielectric film 95, the diffusion of the P type dopant in the X axis direction is suppressed by the embedded dielectric film 95. This makes it possible to reduce the width of the guard ring 92 in the X axis direction. Further, as described with reference to FIG. 4, the embedded dielectric film 95 exists, so that the end portion 203 of the guard ring 92 is arranged below the upper surface 21. This also makes it possible to reduce the width of the guard ring 92 in the X axis direction. In the manufacturing method of this example, the width of the edge termination structure portion 90 can be designed to be small, in consideration of the fact that the width of the guard ring 92 is reduced.

In the example of FIG. 7, the implantation step S706 is performed after the recess forming step S702 and the dielectric film forming step S704. However, after forming the guard ring 92 by the implantation step S706, the recess forming step S702 and the dielectric film forming step S704 may also be performed. Also in this case, since the end portion 204 of the guard ring 92 described with reference to FIG. 4 is removed by the recess forming step S702, the width of the guard ring 92 can be reduced.

Figure 8:
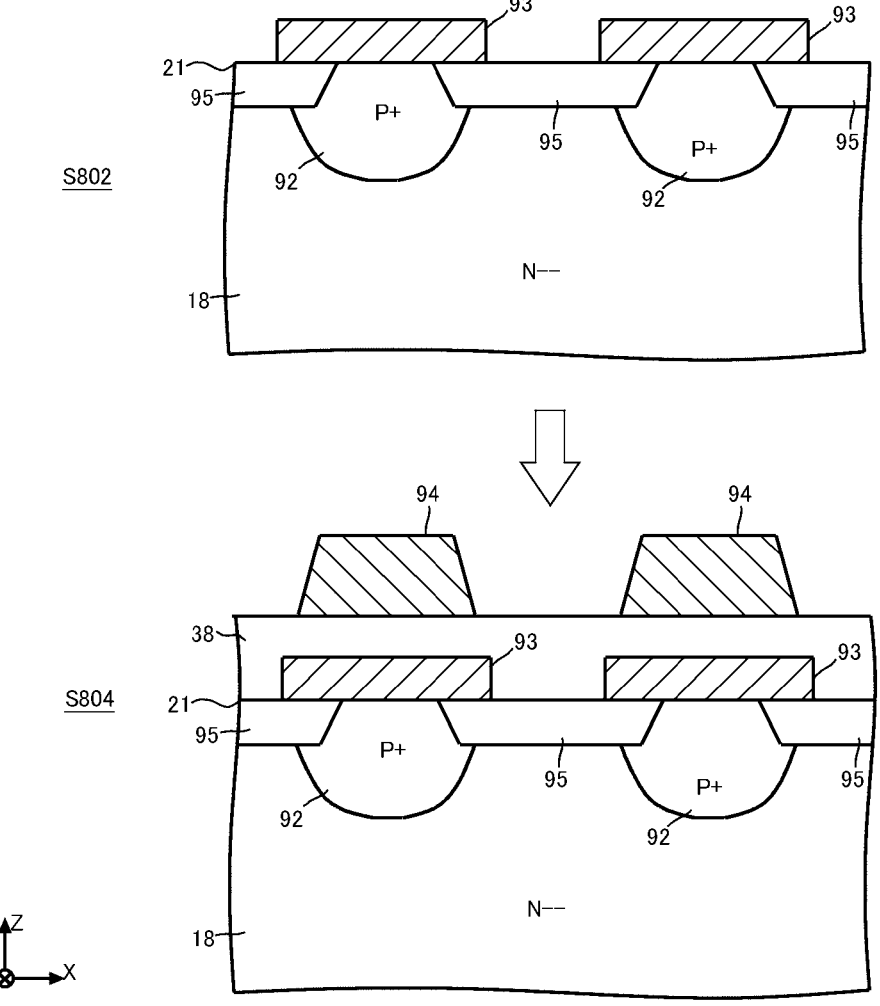
FIG. 8 illustrates a manufacturing process after the manufacturing process shown in FIG. 7.

FIG. 8 illustrates a manufacturing process after the manufacturing process shown in FIG. 7. After forming the embedded dielectric film 95 and the guard ring 92, the field plate 93 is formed above the guard ring 92 in a field plate forming step S802. Before forming the field plate 93, an oxide film covering the upper surface 21 of the semiconductor substrate 10 may be formed. The oxide film may be formed with the same process as that of the gate dielectric film 42. Further, in S802, at least a part of other portions (for example, the gate conductive portion 44, the dummy conductive portion 34, the gate runner such as the outer circumferential gate runner 130-2, the outer plate 96, and the like) formed of polysilicon may also be formed. Note that, there may be a partial forming process of the active portion 160 between the implantation step S706 and the field plate forming step S802. The partial forming process of the active portion 160 may be, for example, a process of forming a trench portion, or the like.

Next, in a field electrode forming step S804, the field electrode 94 is formed above the field plate 93. It is preferable to form the interlayer dielectric film 38 before forming the field electrode 94. In S804, at least a part of other portions (for example, the emitter electrode 52, the gate runner such as the outer circumferential gate runner 130-1, the outer electrode 97, and the like) formed of a metal material may also be formed. Note that, there may be other forming process of the active portion 160 between the field plate forming step S802 and the field electrode forming step S804. The other forming process of the active portion 160 may be, for example, a forming process of a base region, an emitter region, a contact region, or the like. By such a process, the semiconductor device 100 can be manufactured.

FIG. 9 illustrates an example of a C-C cross section in FIG. 1. The C-C cross section is a cross section perpendicular to the XY plane in the vicinity of a corner portion of the semiconductor substrate 10. As described above, the field plate 93 and the field electrode 94 are connected via a contact hole 240 provided in the interlayer dielectric film 38. In addition, the field electrode 94 and the guard ring 92 are also connected via the contact hole 240 provided in the interlayer dielectric film 38. The guard ring 92 may have a contact region 242 of P++ type having a higher concentration than other portions, in a region in contact with the contact hole 240.

The field plate 93 may have an opening for passing through the contact hole 240 connecting the field electrode 94 and the guard ring 92. In addition, the outer electrode 97 and the outer plate 96 are also connected via the contact holes 240 provided in the interlayer dielectric film 38. In the contact holes 240, a metal material such as aluminum or tungsten may be filled. The contact holes 240 may be provided in the vicinity of the four corner portions of the semiconductor substrate 10.

The channel stopper 98 may be connected to the outer electrode 97 via the contact hole 240. The outer electrode 97 may be connected to the outer plate 96 via the contact hole. The contact region 242 may be provided on the upper surface of the channel stopper 98 at a lower part of the contact hole 240. A dielectric film (not shown) may be provided between the outer plate 96 and the channel stopper 98. The potential of the channel stopper 98 is the same as the potential of the collector electrode 24. In the vicinity of the four corner portions of the semiconductor substrate 10, the potential of the outer electrode 97 or the outer plate 96 is made to be the same as the potential of the channel stopper 98. Thereby, the outer electrode 97 formed in a ring shape can prevent the depletion layer from reaching an end surface of the semiconductor substrate.

Figure 10:
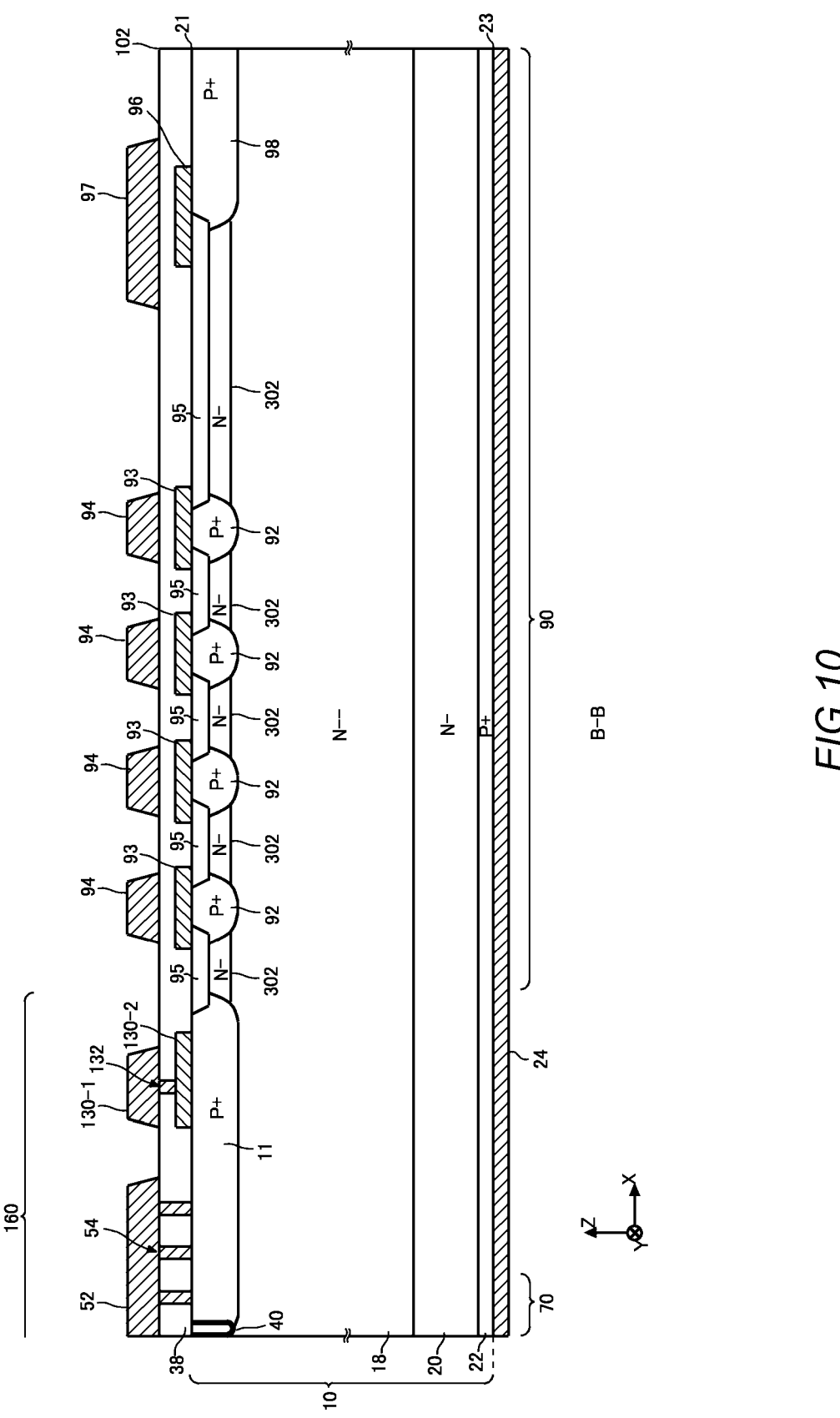
FIG. 10 illustrates another example of the B-B cross section.

FIG. 10 illustrates another example of the B-B cross section. In the semiconductor substrate 10 of this example, both a dopant of a first conductivity type (for example, phosphorous) and a dopant of a second conductivity type (for example, boron) are distributed throughout. A dopant concentration of the first conductivity type is higher than a dopant concentration of the second conductivity type. That is, the semiconductor substrate 10 is a substrate of the first conductivity type (N type in this example).

The semiconductor device 100 of this example further has a high concentration region 302, with respect to any form described with reference to FIGS. 1 to 10. The high concentration region 302 is provided in contact with a dielectric film below the dielectric film provided on the upper surface 21 of the semiconductor substrate 10. The dielectric film of this example is the embedded dielectric film 95. The high concentration region 302 is a region of N– type having a higher doping concentration than that of the drift region 18.

The high concentration region 302 may cover a lower surface of the dielectric film provided on the upper surface 21 of the semiconductor substrate 10 so that the dielectric film is not in direct contact with the drift region 18. The high concentration region 302 may not be provided on the lower surface of the dielectric film covered with a region (for example, the guard ring 92, the well region 11 and the like) having a higher doping concentration than that of the drift region 18. In this example, the high concentration region 302 is provided between the two guard rings 92. The high concentration region 302 may be provided between the outermost guard ring 92 and the channel stopper 98. The high concentration region 302 may be provided between the innermost guard ring 92 and the well region 11.

Figure 11:
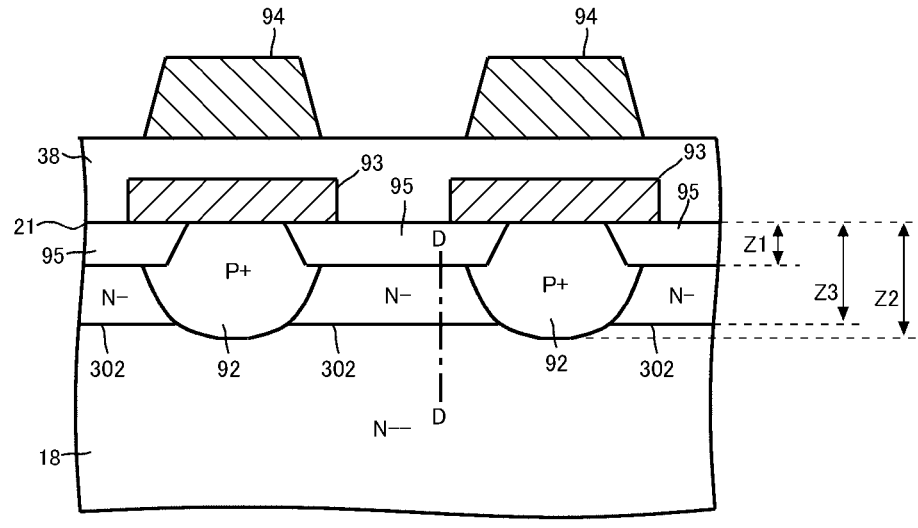
FIG. 11 illustrates an enlarged view of a vicinity of a high concentration region 302.
Figure 11:

FIG. 11 illustrates an enlarged view of a vicinity of the high concentration region 302. A distance in the depth direction from the upper surface 21 of the semiconductor substrate 10 to a lower end of the high concentration region 302 is denoted as Z3. The distance Z3 is greater than the distance Z1. The distance Z3 may be smaller than the distance Z2, may be the same as the distance Z2, or may also be greater than the distance Z2. In the example of FIG. 11, the distance Z3 is slightly smaller than the distance Z2. The distance Z3 may be less than 1 times of the distance Z2 or may be 0.9 times or less. The distance Z3 may be 0.5 times or more of the distance Z2 or may be 0.7 times or more.

Figure 12:
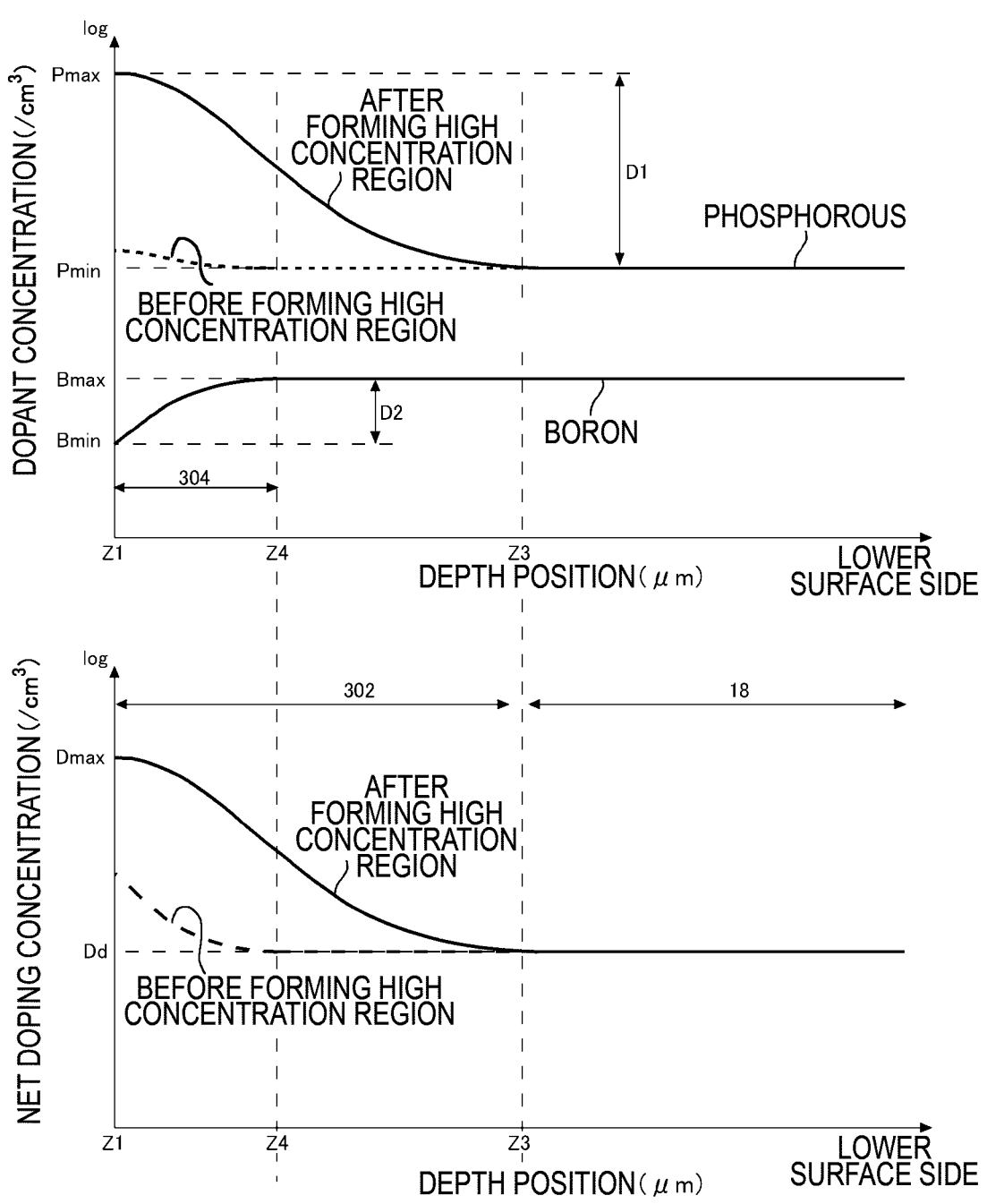
FIG. 12 illustrates a distribution example of an N type dopant concentration, a P type dopant concentration and a net doping concentration in a D-D line of FIG. 11.

FIG. 12 illustrates a distribution example of an N type dopant concentration, a P type dopant concentration and a net doping concentration in a D-D line of FIG. 11. The D-D line is parallel to the Z axis and passes through a part of the high concentration region 302 and the drift region 18. In this example, the N type dopant is phosphorous and the P type dopant is boron. The horizontal axis in FIG. 12 indicates the depth position with respect to the upper surface 21 of the semiconductor substrate 10. However, the depth position Z1 of the lower end of the embedded dielectric film 95 is set as the origin of the horizontal axis.

As described above, both phosphorous and boron are distributed throughout the semiconductor substrate 10. The entire doping concentration of the semiconductor substrate 10 is adjusted by a concentration difference between phosphorous and boron. In a region where phosphorous and boron are not locally implanted, the concentrations of phosphorous and boron are substantially constant throughout the semiconductor substrate 10.

However, in the vicinity of the dielectric film, the impurities included in the semiconductor substrate 10 are sucked or segregated to the dielectric film, so that the impurity concentration may vary. In the example of FIG. 12, in the processes such as thermal oxidation for forming the embedded dielectric film 95, the embedded dielectric film 95 grows while taking in boron in the near region. For this reason, the boron concentration in the near region of the embedded dielectric film 95 decreases toward the embedded dielectric film 95. In addition, the embedded dielectric film 95 grows while sweeping out phosphorous in the near region. For this reason, the phosphorous concentration in the near region of the embedded dielectric film 95 increases toward the boundary with the embedded dielectric film 95. In FIG. 12, the phosphorous concentration distribution and the net doping concentration distribution before forming the high concentration region 302 are shown by broken lines, and the phosphorous concentration distribution and the net doping concentration distribution after forming the high concentration region 302 are shown by solid lines.

In the vicinity of the embedded dielectric film 95, since the concentration of phosphorous increases and the concentration of boron decreases, the net doping concentration in the N type region increases. For this reason, in the semiconductor substrate 10 of N type in which the P type dopant such as boron is distributed throughout the substrate, the net doping concentration in the N type region in the vicinity of the embedded dielectric film 95 greatly increases. Since an amount of increase in the net doping concentration varies depending on the manufacturing process, the variation in the net doping concentration in the vicinity of the embedded dielectric film 95 increases.

In this example, the high concentration region 302 of N type is formed in contact with the embedded dielectric film 95. The dopant concentration in the high concentration region 302 can be controlled relatively precisely by an amount of ion implantation or the like. For this reason, the dopant concentration in the region below the embedded dielectric film 95 includes not only the components that vary due to the suction or the like of impurities but also the components that can be controlled precisely. Therefore, the controllability of the net doping concentration in the region below the embedded dielectric film 95 can be improved.

In this example, a region, which is in contact with the embedded dielectric film 95 below the embedded dielectric film 95 and in which the dopant concentration of the second conductivity type (boron, in this example) monotonically decreases toward the embedded dielectric film 95, is set as a reduction region 304. That is, in the reduction region 304, the closer the distance to the embedded dielectric film 95 is, the lower the dopant concentration of the second conductivity type is.

A maximum value of the boron concentration in the reduction region 304 is denoted as Bmax, and a minimum value is denoted as Bmin. The concentration Bmax may be the same as the boron concentration in the drift region 18. Note that, each concentration at the center of the semiconductor substrate 10 in the depth direction may be used as each concentration in the drift region 18. In addition, an average value of each concentration in a region including the center in the depth direction of the semiconductor substrate 10 and having a predetermined width in the depth direction may be used as each concentration in the drift region 18. The predetermined width may also be, for example, 10 μm or 20 μm. The concentration Bmin may be the boron concentration at the boundary with the embedded dielectric film 95. A difference between the concentration Bmax and the concentration Bmin is denoted as D2.

In addition, a lower end position of the reduction region 304 is denoted as Z4. The position Z4 is a position where the boron concentration starts to decrease from the concentration Bmax in the drift region 18. In a case where the position where the concentration starts to decrease is not clear, a position where the boron concentration becomes 0.9×Bmax in a direction from the drift region 18 toward the embedded dielectric film 95 may be set as the position Z4.

A maximum value of the phosphorous concentration in the high concentration region 302 is denoted as Pmax, and a minimum value is denoted as Pmin. The concentration Pmin may be the same as the phosphorous concentration in the drift region 18. The concentration Pmax may also be the phosphorous concentration at the boundary with the embedded dielectric film 95. A difference between the concentration Pmax and the concentration Pmin is denoted as D1.

In addition, the lower end position of the high concentration region 302 is denoted as Z3. The position Z3 is a position where the net doping concentration starts to increase from a concentration Dd in the drift region 18. In a case where the position where the concentration starts to increase is not clear, a position where the net doping concentration becomes 1.1×Dd in the direction from the drift region 18 toward the embedded dielectric film 95 may be set as the position Z3.

As described above, the difference D1 of the phosphorous concentration in the high concentration region 302 can be controlled relatively precisely by the amount of ion implantation or the like. On the other hand, the difference D2 of the boron concentration in the reduction region 304 varies greatly in the manufacturing process. The controllability of the net doping concentration in the near region of the embedded dielectric film 95 is improved by increasing a ratio of the dopant concentration (difference D1, in this example) that can be controlled precisely. The difference D1 of the phosphorous concentration in the high concentration region 302 is preferably greater than the difference D2 of the boron concentration in the reduction region 304. The difference D1 may be 2 times or more, 5 times or more, or 10 times or more of the difference D2.

On the other hand, if the phosphorous concentration in the high concentration region 302 is increased too much, the doping concentration of the adjacent guard ring 92 is affected. The maximum value Dmax of the net doping concentration in the high concentration region 302 may be smaller than the maximum value of the net doping concentration of the guard ring 92. The maximum value Dmax of the net doping concentration in the high concentration region 302 may be 1/10 or less or 1/100 or less of the maximum value of the net doping concentration of the guard ring 92.

In addition, the maximum value Dmax of the net doping concentration in the high concentration region 302 may be 10 times or more, 20 times or more, 50 times or more or 100 times or more of the net doping concentration Dd in the drift region 18. The maximum value Dmax of the net doping concentration in the high concentration region 302 may be $1 \times 10^{14}/cm^3$ or more, $5 \times 10^{14}/cm^3$ or more, or $1 \times 10^{15}/cm^3$ or more.

Further, the high concentration region 302 is preferably provided up to a position below the reduction region 304. That is, the position Z3 is preferably arranged on the further lower surface 23 side than the position Z4. This makes it possible to reduce the variation in the net doping concentration due to the reduction region 304. A width (Z3−Z1) in the depth direction of the high concentration region 302 may be 1.5 times or more, 2 times or more, or 5 times or more of a width (Z4−Z1) in the depth direction of the reduction region 304. As shown in FIG. 11, the lower end of the high concentration region 302 may be arranged on the further upper surface 21 side of the semiconductor substrate 10 than the lower end of the guard ring 92.

Figure 13:
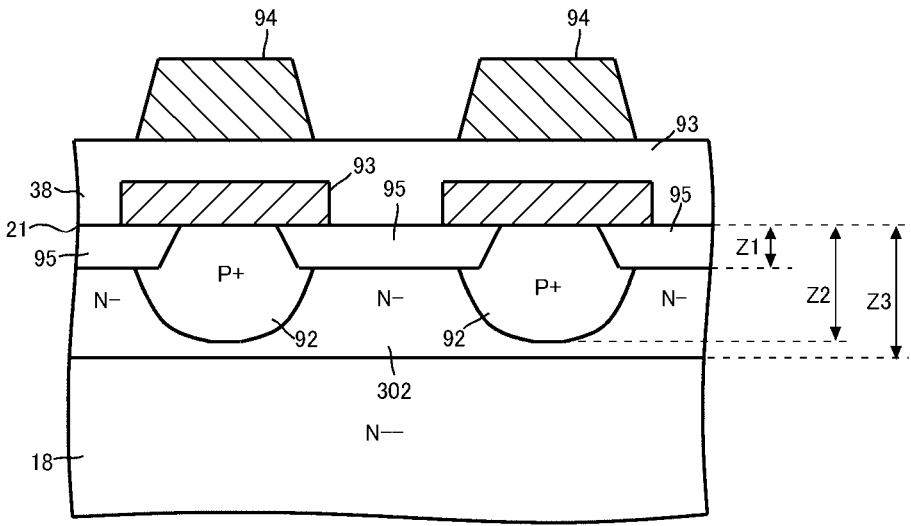
FIG. 13 illustrates another example of the high concentration region 302.
Figure 13:
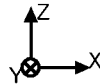

FIG. 13 illustrates another example of the high concentration region 302. In this example, the lower end of the high concentration region 302 is arranged on the lower surface 23 side of the semiconductor substrate 10 with respect to the lower end of the guard ring 92. That is, the distance Z3 from the upper surface 21 to the lower end of the high concentration region 302 is greater than the distance Z2 from the upper surface 21 to the lower end of the guard ring 92. The high concentration region 302 may also be provided in the active portion 160, or may not be provided.

Figure 14:
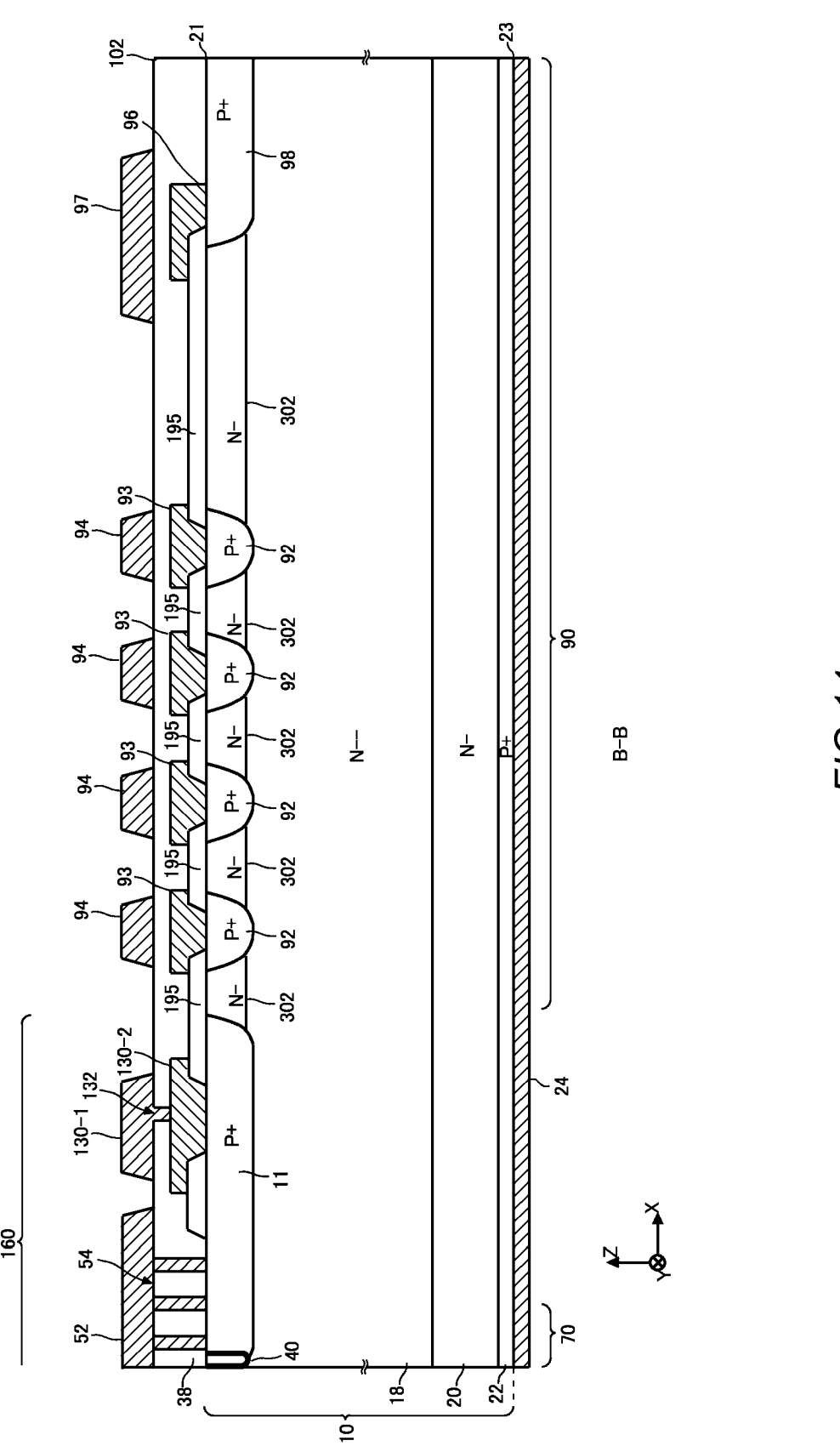
FIG. 14 illustrates another example of the B-B cross section.

FIG. 14 illustrates another example of the B-B cross section. The semiconductor device 100 of this example has a dielectric film 195, instead of the embedded dielectric film 95, with respect to any configuration described with reference to FIGS. 10 to 13. The dielectric film 195 is, for example, a thermal oxide film. The other structures are the same as any configuration described with reference to FIGS. 10 to 13.

The dielectric film 195 is provided on the upper surface 21 of the semiconductor substrate 10. A position where the dielectric film 195 is provided on the XY plane is similar to that of the embedded dielectric film 95. That is, the dielectric film 195 is arranged between the two guard rings 92 on the XY plane. At least a part of the dielectric film 195 is provided above the upper surface 21 of the semiconductor substrate 10. The entire dielectric film 195 may be provided on a further upper side than the upper surface 21 of the semiconductor substrate 10. The guard ring 92 is formed up to a position below the dielectric film 195. In addition, the dielectric film 195 may be a film in which a first dielectric film and a second dielectric film are stacked, as in the example of FIG. 5.

The high concentration region 302 is in contact with the dielectric film 195 below the dielectric film 195. The high concentration region 302 of this example is exposed on the upper surface 21 of the semiconductor substrate 10. The dielectric film 195 is configured to cover the high concentration region 302 exposed on the upper surface 21. Below the dielectric film 195, the reduction region 304 described with reference to FIG. 12 is formed. Also in this example, by providing the high concentration region 302, the influence of the variation in the net doping concentration due to the reduction region 304 can be reduced.

Figure 15:
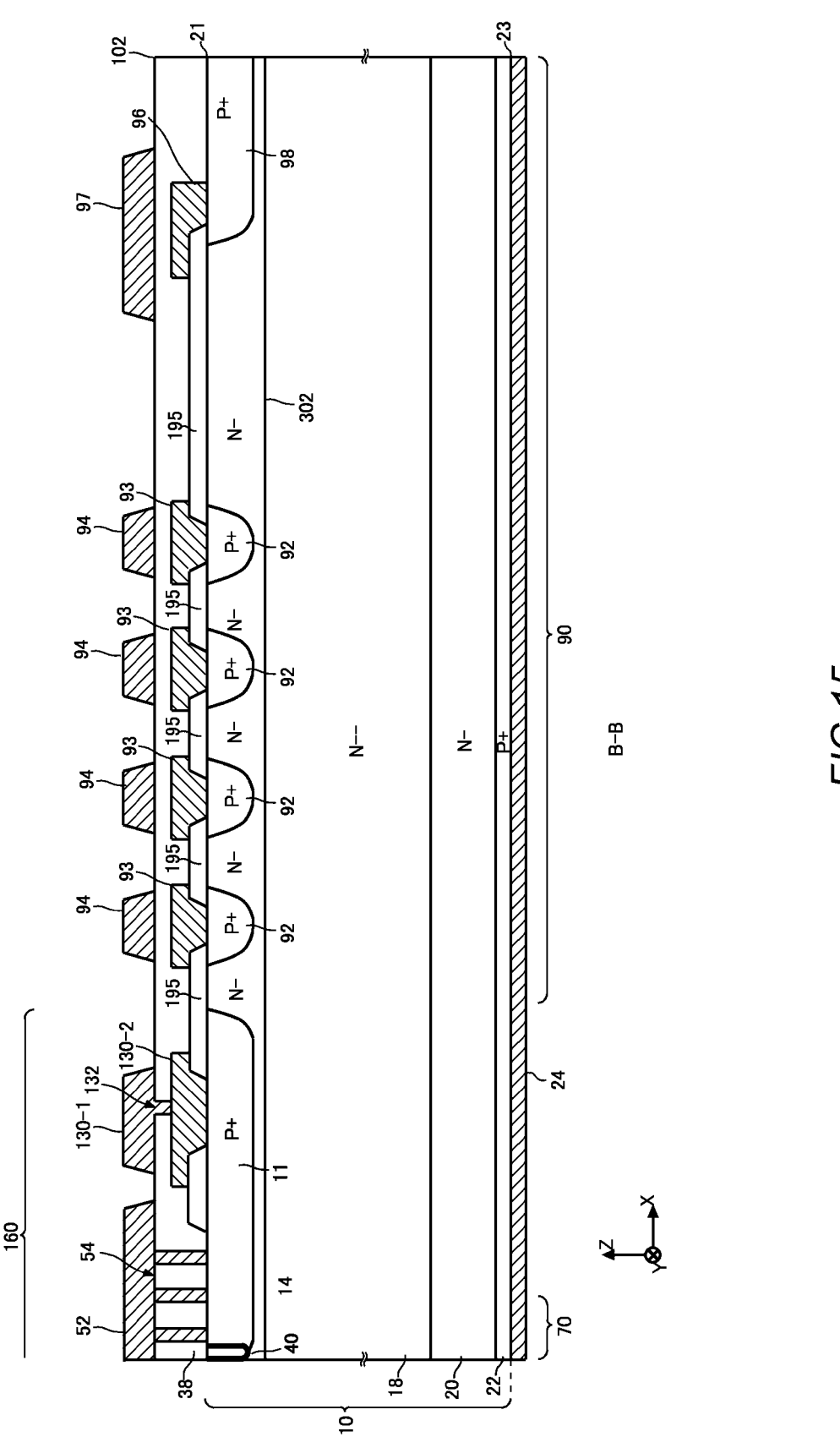
FIG. 15 illustrates another example of the B-B cross section.

FIG. 15 illustrates another example of the B-B cross section. A structure of the high concentration region 302 is different from the configuration shown in FIG. 14. The other structures are similar to those in the example shown in FIG. 14. The high concentration region 302 of this example has a similar structure to that of the high concentration region 302 described with reference to FIG. 13. That is, the high concentration region 302 of this example is formed deeper than the guard ring 92. Also in this example, by providing the high concentration region 302, the influence of the variation in the net doping concentration due to the reduction region 304 can be reduced.

Figure 16:
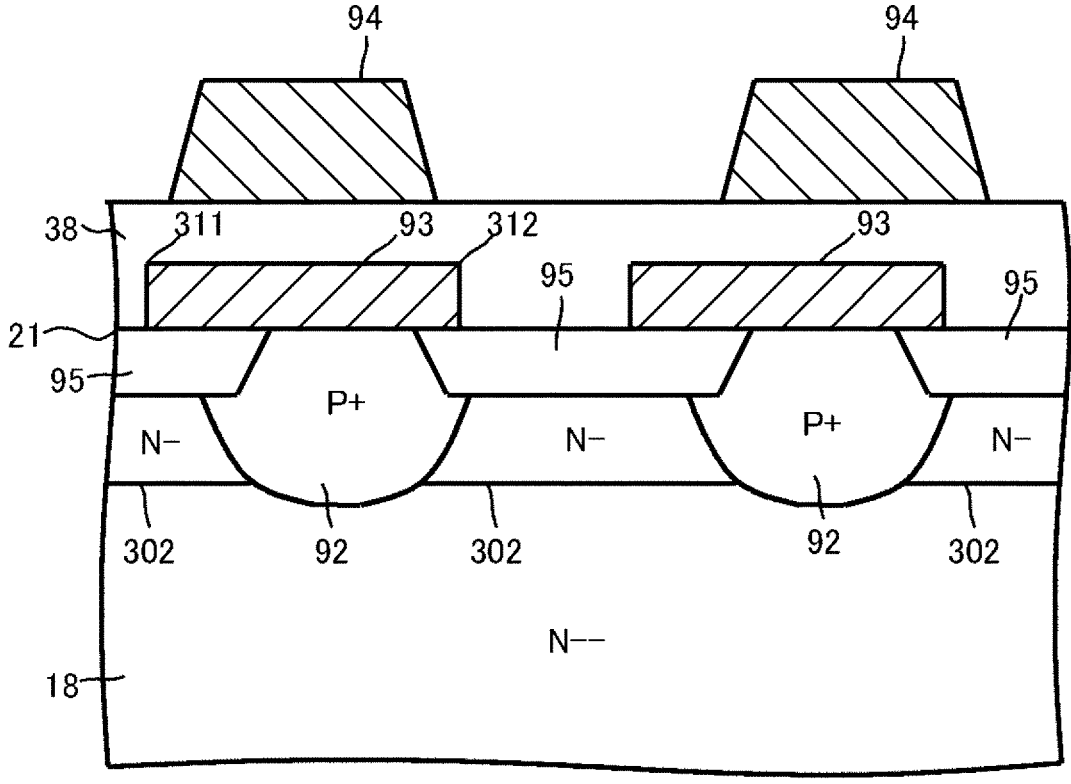
FIG. 16 illustrates an arrangement example of the field plate 93.
Figure 16:
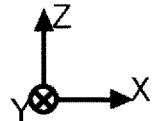

FIG. 16 illustrates an arrangement example of the field plate 93. The field plate 93 of this example is arranged biased toward the active portion 160 side with respect to the lower guard ring 92. For example, in the X axis direction, a center position of the field plate 93 is arranged on the active portion 160 side with respect to a center position of the guard ring 92.

In this example, among the end portions of the field plate 93, an end portion on the active portion 160 side is referred to as an end portion 311 and an end portion on the end side 102 side is referred to as an end portion 312. The end portion 311 may be arranged on the active portion 160 side with respect to the guard ring 92. The end portion 312 may be arranged at a position where it overlaps the guard ring 92. At least one field plate 93 may be arranged as shown in FIG. 16, and all the field plates 93 may also be arranged as shown in FIG. 16. The arrangement of the field plate 93 of this example may be applied to any of the forms shown in FIGS. 1 to 15.

Figure 17:
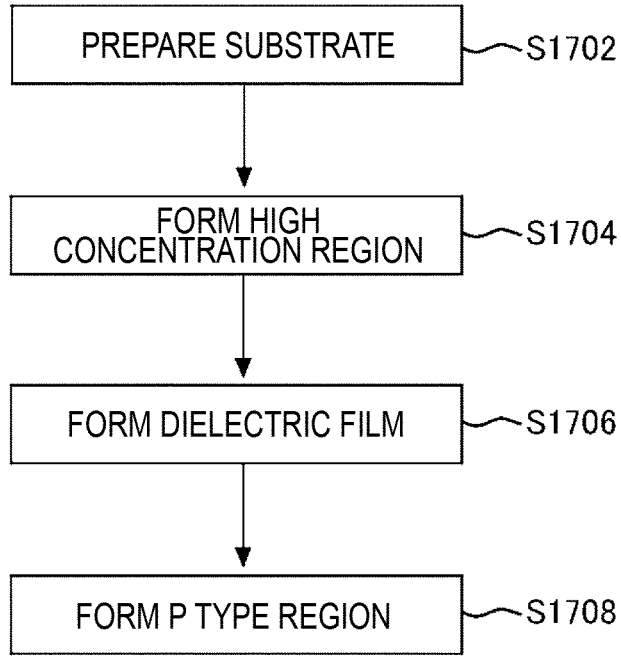
FIG. 17 illustrates a part of processes in the manufacturing method of the semiconductor device 100 having the high concentration region 302.

FIG. 17 illustrates a part of processes in the manufacturing method of the semiconductor device 100 having the high concentration region 302. In this example, the semiconductor substrate 10 is prepared in a substrate preparation step S1702. For example, the semiconductor substrate 10 is a substrate in which both a dopant of a first conductivity type and a dopant of a second conductivity type are distributed throughout. In addition, as shown in FIG. 10, when forming the embedded dielectric film 95, the recess 232 (refer to FIG. 7) is formed on the semiconductor substrate 10 in the substrate preparation step S1702. The method of forming the recess 232 is similar to the recess forming step S702 described with reference to FIG. 7.

Next, in a high concentration region forming step S1704, the high concentration region 302 is formed in at least a part of the region of the upper surface 21 of the semiconductor substrate 10. In S1704, the high concentration region 302 is formed by selectively implanting N type dopant ions such as phosphorous from the upper surface 21 of the semiconductor substrate 10. When the recess 232 is formed on the semiconductor substrate 10, N type dopant ions such as phosphorous are implanted from the bottom surface of the recess 232. In this case, the mask 230 shown in FIG. 7 may be used as a mask for ion implantation. After implanting the N type dopant ions, the semiconductor substrate 10 may be heat-treated in S1704. In another example, the heat treatment for the semiconductor substrate 10 may be performed in a process after S1704.

Next, in a dielectric film forming step S1706, the dielectric film 195 or the embedded dielectric film 95 arranged in contact with the high concentration region 302 on the upper surface 21 of the semiconductor substrate 10 is formed. The embedded dielectric film 95 can be formed in a similar method to S704 of FIG. 7. When forming the dielectric film 195, the dielectric film 195 may be formed by thermally oxidizing the entire upper surface 21 of the semiconductor substrate 10 to form an oxide film and selectively removing the oxide film. In another example, the upper surface 21 of the semiconductor substrate 10 may be selectively thermally oxidized to form the dielectric film 195. In S1706, when the dielectric film 195 or the embedded dielectric film 95 is formed, the reduction region 304 (refer to FIG. 12) is also formed. Since the high concentration region 302 is formed, an influence of the reduction region 304 on the doping concentration can be reduced.

Next, in a P type region forming step S1708, a P type region such as the guard ring 92 is formed. The forming method of the guard ring 92 and the like is similar to S706 in FIG. 7. In S1708, the well region 11 and the channel stopper 98 may be formed. By such a process, the semiconductor device 100 can be manufactured.

Figure 18:
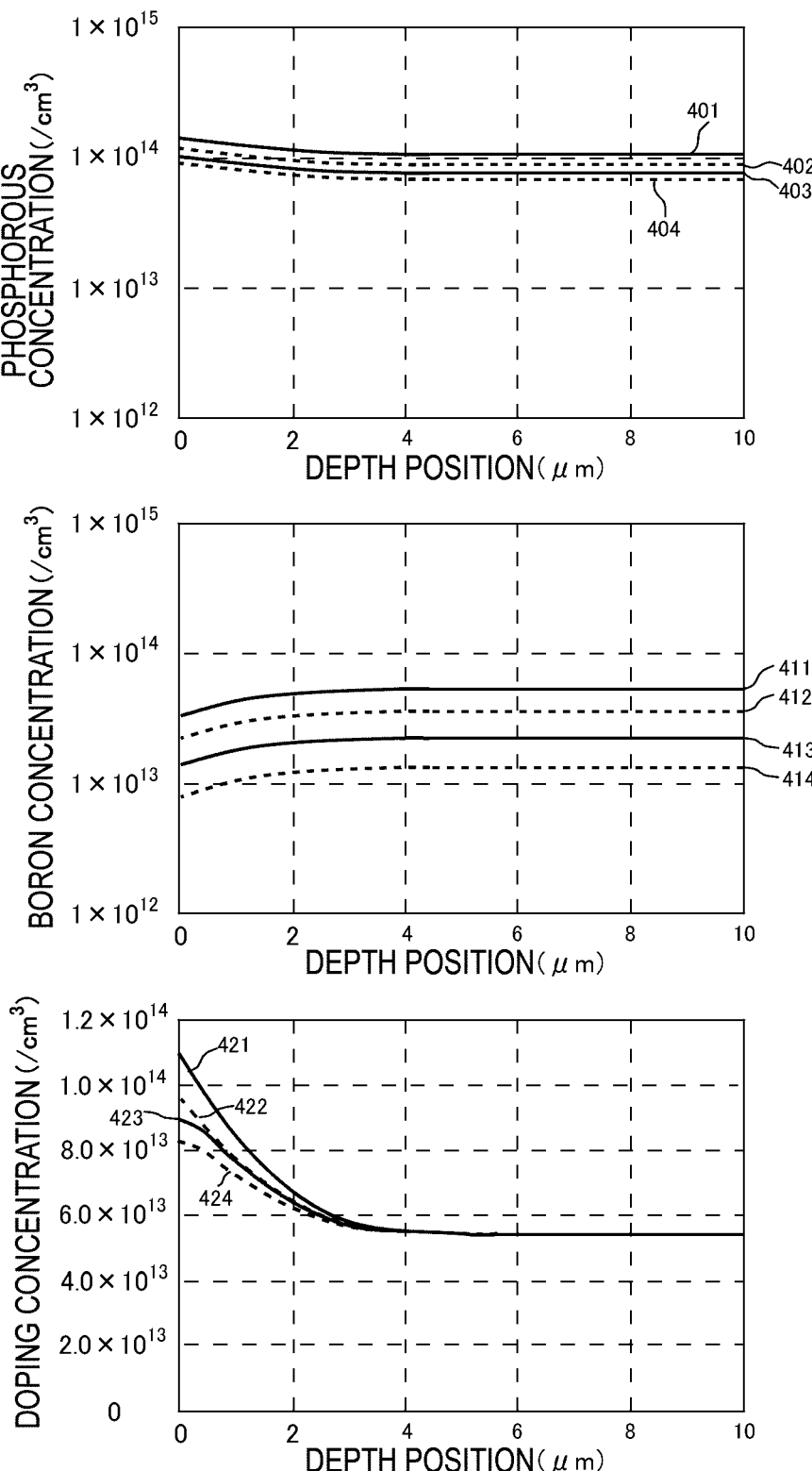
FIG. 18 illustrates an example of bulk donor and bulk acceptor concentration distributions and a net doping concentration distribution.

FIG. 18 illustrates an example of bulk donor and bulk acceptor concentration distributions and a net doping concentration distribution. FIG. 18 illustrates the distributions before forming the high concentration region 302. The horizontal axis in FIG. 18 indicates a distance in the Z axis direction from the lower end of the dielectric film 195. In this example, the bulk donor is phosphorous and the bulk acceptor is boron.

FIG. 18 illustrates four examples in which a ratio of the bulk donor concentration Nd and the bulk acceptor concentration Na is different. As described above, for the bulk donor and bulk acceptor concentrations, the concentration value at the center of the semiconductor substrate 10 in the depth direction may be used. In the four examples, the net doping concentration distribution in the drift region 18 is the same. A phosphorous concentration distribution 401, a boron concentration distribution 411 and a doping concentration distribution 421 are examples in which Na/Nd is 0.5, a phosphorous concentration distribution 402, a boron concentration distribution 412 and a doping concentration distribution 422 are examples in which Na/Nd is 0.4, a phosphorous concentration distribution 403, a boron concentration distribution 413 and a doping concentration distribution 423 are examples in which Na/Nd is 0.3, and a phosphorous concentration distribution 404, a boron concentration distribution 414 and a doping concentration distribution 424 are examples in which Na/Nd is 0.2.

Similar to the example of FIG. 12, in any of the examples of FIG. 18, the phosphorous concentration increases and the boron concentration decreases in the direction toward the dielectric film 195. In any of the examples of FIG. 18, the phosphorous concentration and the boron concentration at the boundary with the dielectric film 195 vary by about 30% with respect to each concentration in the drift region 18. Since the boron concentration decreases in the vicinity of the dielectric film 195, the net doping concentration approaches the phosphorous concentration as the distance from the dielectric film 195 decreases.

A difference between the bulk donor concentration Nd and the bulk donor concentration Na is defined as a bulk net doping concentration Nnet. That is, the bulk net doping concentration Nnet is expressed by the following formula.

$$Nnet = Nd - Na \qquad \text{formula (1a)}$$

Further, assuming that Na/Nd is $\alpha$, the formula (1a) is modified as shown in the following formula.

$$Nnet = (1-\alpha)Nd = (1/\alpha - 1)Na \qquad \text{formula (1b)}$$

Note that, in this example, Nd>Na and $\alpha$<1.

The donor concentration at the boundary with the dielectric film 195 is denoted as Nd_s, and the acceptor concentration is denoted as Na_s. The net doping concentration Nnet_s at the boundary with the dielectric film 195 is given by the following formula.

$$Nnet\_s = Nd\_s - Na\_s \qquad \text{formula (2)}$$

In each example shown in FIG. 18, the acceptor concentration Na_s is 58% to 62% of the bulk acceptor concentration Na. Here, it is assumed that Na_s=0.6Na. In addition, since Na_s=0.6$\alpha$Nd from the formula (1a), the formula (2) becomes the following formula.

$$Nnet\_s = Nd\_s - 0.6\alpha Nd \qquad \text{formula (3)}$$

In addition, the donor concentration Nd_s is expressed as shown in the following formula.

$$Nd\_s = \beta Nd \qquad \text{formula (4)}$$

In each example shown in FIG. 18, since the donor concentration Nd_s at the boundary is 130% to 140% of the bulk donor concentration Nd, $\beta$ is 1.3 to 1.4. Here, it is assumed that $\beta$=1.35.

From the formula (4), the formula (3) can be modified as follows.

$$Nnet\_s = Nd\_s - 0.6\alpha Nd$$

$$= 1.35 Nd - 0.6\alpha Nd$$

$$= (1.35 - 0.6\alpha)Nd \qquad \text{formula (5)}$$

In addition, from the formula (1b), the formula (5) can be modified as follows.

$$Nnet\_s = (1.35 - 0.6\alpha)Nd$$

$$= (1.35 - 0.6\alpha)(1/(1-\alpha))Nnet \qquad \text{formula (6)}$$

As shown in the formula (6), when the semiconductor substrate 10 in which the bulk donor and the bulk acceptor exist is oxidized, the net doping concentration in the vicinity of the oxide film can be expressed by the bulk net doping concentration Nnet and the ratio $\alpha$ of the bulk acceptor concentration and the bulk donor concentration.

Further, the net doping concentration on the surface of the high concentration region 302 (i.e., the boundary with the dielectric film 195) when the high concentration region 302 is formed is denoted as NF_s. If the concentration NF_s is sufficiently greater than the concentration Nnet_s, it can be less susceptible to variations in acceptor and donor concentrations in the reduction region 304 (refer to FIG. 12). That is, the concentration NF_s preferably satisfies the following formula.

$$NF\_s \geq \gamma Nnet\_s \qquad \text{formula (7)}$$

Here, $\gamma$ is a value greater than 1. As an example, $\gamma$ may be 2 or more, 5 or more, or 7 or more. In addition, $\gamma$ may be 50 or less, 30 or less, or 20 or less. In this example, $\gamma$ is 10. Substituting the formula (6) into the formula (7) yields the following formula.

$$NF\_s \geq \gamma(1.35 - 0.6\alpha)(1/(1-\alpha))Nnet \qquad \text{formula (8)}$$

The net doping concentration NF_s on the surface of the high concentration region 302 preferably satisfies the formula (8).

Figure 19:
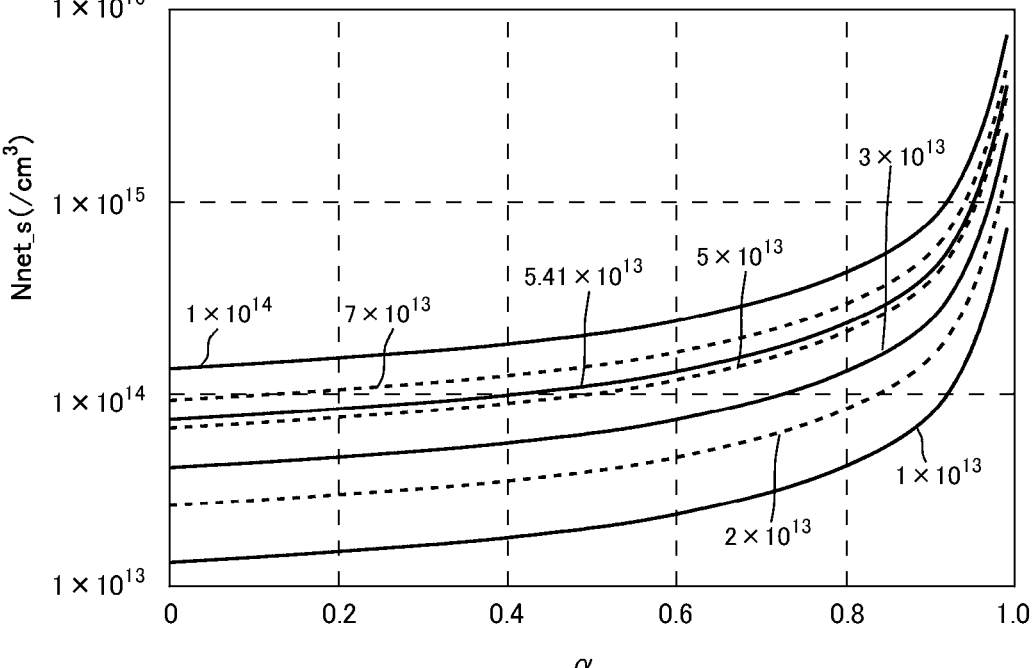
FIG. 19 illustrates a relationship between a concentration Nnet_s and $\alpha$.

FIG. 19 illustrates a relationship between the concentration Nnet_s and $\alpha$. FIG. 19 illustrates each of examples in which the bulk net doping concentration Nnet is set to $1 \times 10^{13}/\text{cm}^3$, $2 \times 10^{13}/\text{cm}^3$, $3 \times 10^{13}/\text{cm}^3$, $5 \times 10^{13}/\text{cm}^3$, $5.41 \times 10^{13}/\text{cm}^3$, $7 \times 10^{13}/\text{cm}^3$ and $1 \times 10^{14}/\text{cm}^3$. As the bulk acceptor concentration Na increases and a approaches 1, the amount of reduction in the acceptor concentration in the reduction region 304 also increases, so that the concentration Nnet_s increases. In a region where the concentration Nnet_s little changes with respect to $\alpha$ and illustrates a stable value, the effect of stabilizing the breakdown voltage can be obtained. From this, $\alpha$ may be 0.7 or less, 0.6 or less, 0.5 or less, or 0.4 or less. On the other hand, if the concentration Nnet_s is set relatively high, the breakdown voltage can be stabilized. From this, $\alpha$ may be 0.01 or more, 0.05 or more, 0.1 or more, 0.2 or more, or 0.3 or more.

Figure 20:
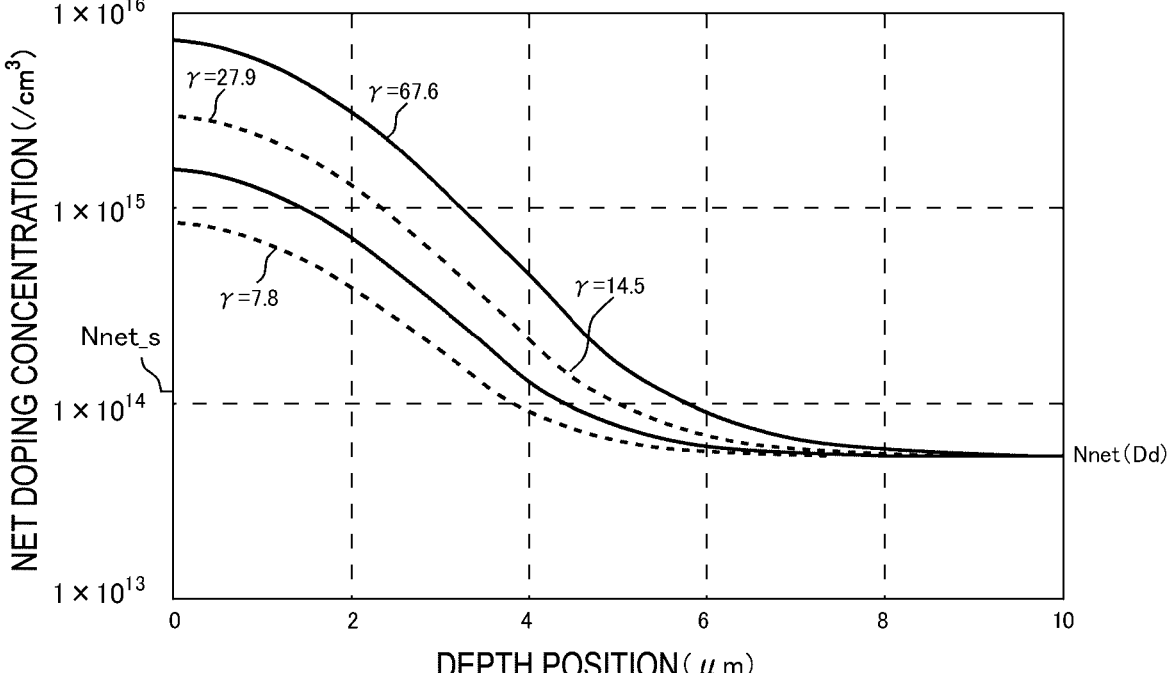
FIG. 20 illustrates an example of the net doping concentration distribution in the high concentration region 302.

FIG. 20 illustrates an example of the net doping concentration distribution in the high concentration region 302. The horizontal axis in FIG. 20 indicates a distance from the lower end of the dielectric film 195. In FIG. 20, four examples where $\gamma$=7.8, 14.5, 27.9 and 67.6 are shown. Note that, in each example, $\alpha$=0.5 and Nnet=$5.41 \times 10^{13}/\text{cm}^3$. Note that, the concentration Nnet_s can be determined from FIG. 19.

Among the examples shown in FIG. 20, in the case where $\gamma$=67.6, the net doping concentration NF_s at the upper end (depth position 0 $\mu$m) of the high concentration region 302 becomes too large, so that the breakdown voltage is reduced. As described above, $\gamma$ may be 50 or less.

In the above example, for the bulk net doping concentration Nnet, the net doping concentration Dd in the drift region 18 measured by the SR method may be used. In addition, the bulk net doping concentration Nnet may be calculated from the difference between the bulk donor concentration Nd and the bulk acceptor concentration Na measured by the SIMS method. As described above, for the net doping concentration Dd, the bulk donor concentration Nd, and the bulk acceptor concentration Na, the values in the center of the semiconductor substrate 10 may be used.

As described above, by forming the high concentration region 302, it is possible to reduce the variation in the net doping concentration of the semiconductor substrate below the embedded dielectric film 95 or the dielectric film 195. This makes it possible to suppress variation in the extension width of the depletion layer when the depletion layer expands across the high concentration region 302 (in the X axis direction). Thereby, it is possible to suppress variations in characteristics in a semiconductor device to which a semiconductor substrate, in which both the dopant of the first conductivity type and the dopant of the second conductivity type are distributed throughout the semiconductor substrate and the concentration of the dopant of the second conductivity type reduces toward the dielectric film, is applied.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, stages and the like of each process performed by an apparatus, system, program, and method shown in the claims, embodiments, or diagrams can be performed in any order as long as the order is not indicated by 'prior to,' 'before,' or the like and as long as the output from a previous process is not used in a later process. Even if the process flow is described using phrases such as 'first' or 'next' in the claims, embodiments, or diagrams, it does not necessarily mean that the process must be performed in this order.

EXPLANATION OF REFERENCES

10: semiconductor substrate, 11: well region, 12: emitter region, 14: base region, 16: accumulation region, 18: drift region, 20: buffer region, 21: upper surface, 22: collector region, 23: lower surface, 24: collector electrode, 30: dummy trench portion, 32: dummy dielectric film, 34: dummy conductive portion, 38: interlayer dielectric film, 40: gate trench portion, 42: gate dielectric film, 44: gate conductive portion, 52: emitter electrode, 54: contact hole, 60, 61: mesa portion, 70: transistor portion, 80: diode portion, 81: extension region, 82: cathode region, 90: edge termination structure portion, 92: guard ring, 93: field plate, 94: field electrode, 95: embedded dielectric film, 96: outer plate, 97: outer electrode, 98: channel stopper, 100: semiconductor device, 102: end side, 112: gate pad, 130: outer circumferential gate runner, 131: active-side gate runner, 132: contact hole, 160: active portion, 195: dielectric film, 201: flat portion, 202, 203, 204: end portion, 206: first dielectric film, 208: second dielectric film, 210, 214: valley portion, 218: extension portion, 230: mask, 232: recess, 234: mask, 240: contact hole, 242: contact region, 302: high concentration region, 304: reduction region, 311, 312: end portion, 401, 402, 403, 404: phosphorous concentration distribution, 411, 412, 413, 414: boron concentration distribution, 421, 422, 423, 424: doping concentration distribution

What is claimed is:
1. A semiconductor device comprising:
a semiconductor substrate having a drift region of a first conductivity type;
an active portion, in which at least one of a transistor portion and a diode portion is provided in the semiconductor substrate; and
an edge termination structure portion provided farther outward than the active portion in the semiconductor substrate,
wherein the edge termination structure portion has:
a plurality of guard rings of a second conductivity type provided in contact with an upper surface of the semiconductor substrate, and
an embedded dielectric film arranged between two guard rings and at least partially embedded in the semiconductor substrate, and
wherein the plurality of guard rings is provided below the embedded dielectric film,
wherein the semiconductor device comprises a high concentration region of the first conductivity type provided in contact with the embedded dielectric film below the embedded dielectric film and having a higher doping concentration than that of the drift region, and
wherein the semiconductor device comprises a reduction region which is provided in contact with the embedded dielectric film below the embedded dielectric film and in which a concentration of a dopant of the second conductivity type reduces toward the embedded dielectric film.

2. The semiconductor device according to claim 1, wherein
a depth from the upper surface of the semiconductor substrate to a lower end of the embedded dielectric film is 0.3 µm or more.

3. The semiconductor device according to claim 1, wherein
a depth from the upper surface of the semiconductor substrate to a lower end of the embedded dielectric film is 2 µm or more.

4. The semiconductor device according to claim 1, wherein the embedded dielectric film has:
a first dielectric film; and
a second dielectric film stacked on the first dielectric film.

5. A semiconductor device comprising:
a semiconductor substrate having a drift region of a first conductivity type;
an active portion, in which at least one of a transistor portion and a diode portion is provided in the semiconductor substrate; and
an edge termination structure portion provided farther outward than the active portion in the semiconductor substrate,
wherein the edge termination structure portion has:
a plurality of guard rings of a second conductivity type provided in contact with an upper surface of the semiconductor substrate, and
an embedded dielectric film arranged between two guard rings and at least partially embedded in the semiconductor substrate, and
wherein the plurality of guard rings is provided below the embedded dielectric film,
wherein the semiconductor device comprises a field plate provided from a position above the two guard rings to a position above the embedded dielectric film and formed of polysilicon, wherein the field plate has:

a valley portion recessed toward the upper surface of the semiconductor substrate at a position where the field plate overlaps the embedded dielectric film; and an extension portion extending toward a position closer to a center of the embedded dielectric film than the valley portion.

6. The semiconductor device according to claim 1, wherein a difference between a maximum value and a minimum value of a concentration of a dopant of the first conductivity type in the high concentration region is greater than a difference between a maximum value and a minimum value of the concentration of the dopant of the second conductivity type in the reduction region.

7. The semiconductor device according to claim 1, wherein the high concentration region is provided up to a position below the reduction region.

8. The semiconductor device according to claim 1, wherein a maximum value of a net doping concentration in the high concentration region is 10 times or more of a net doping concentration in the drift region.

9. The semiconductor device according to claim 1, wherein a maximum value of a net doping concentration in the high concentration region is $1 \times 10^{14}/cm^3$ or more.

10. The semiconductor device according to claim 1, wherein a lower end of the high concentration region is arranged on the upper surface side of the semiconductor substrate with respect to lower ends of the plurality of guard rings.

11. The semiconductor device according to claim 1, wherein a lower end of the high concentration region is arranged on a lower surface side of the semiconductor substrate with respect to lower ends of the plurality of guard rings.

12. The semiconductor device according to claim 5, further comprising a high concentration region of the first conductivity type provided in contact with the embedded dielectric film below the embedded dielectric film and having a higher doping concentration than that of the drift region.

13. A semiconductor device comprising:

a semiconductor substrate having a drift region of a first conductivity type;

an active portion, in which at least one of a transistor portion and a diode portion is provided in the semiconductor substrate; and an edge termination structure portion provided farther outward than the active portion in the semiconductor substrate, wherein the edge termination structure portion has:

a plurality of guard rings of a second conductivity type provided in contact with an upper surface of the semiconductor substrate, and an embedded dielectric film arranged between two guard rings and at least partially embedded in the semiconductor substrate, and wherein the plurality of guard rings is provided below the embedded dielectric film, wherein the semiconductor device comprises a high concentration region of the first conductivity type provided in contact with the embedded dielectric film below the embedded dielectric film and having a higher doping concentration than that of the drift region, and wherein a net doping concentration NF_s ($/cm^3$) at a boundary between the high concentration region and the embedded dielectric film satisfies a following formula, $NF\_s \geq \gamma(1.35-0.6\alpha)(1/(1-\alpha))Nnet$, wherein $\gamma$ is a real number of 2 or greater, $\alpha$ is a ratio Na/Nd of a bulk acceptor concentration Na ($/cm^3$) and a bulk donor concentration Nd ($/cm^3$), and Nnet is a bulk net doping concentration ($/cm^3$).

14. The semiconductor device according to claim 13, wherein the $\alpha$ is 0.7 or less.

* * * * *